(12) United States Patent
Su et al.

(10) Patent No.: US 12,543,556 B2
(45) Date of Patent: Feb. 3, 2026

(54) SEMICONDUCTOR DEVICES AND METHODS OF FORMING THE SAME

(71) Applicant: Taiwan Semiconductor Manufacturing Company, Ltd., Hsinchu (TW)

(72) Inventors: Chia-Wei Su, Taoyuan (TW); Yung-Hsu Wu, Taipei (TW); Hsin-Ping Chen, Hsinchu County (TW); Chih Wei Lu, Hsinchu (TW); Wei-Hao Liao, New Taipei (TW); Hsi-Wen Tien, Hsinchu County (TW); Cherng-Shiaw Tsai, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 407 days.

(21) Appl. No.: 18/167,087

(22) Filed: Feb. 10, 2023

(65) Prior Publication Data
US 2024/0194593 A1  Jun. 13, 2024

Related U.S. Application Data

(60) Provisional application No. 63/431,300, filed on Dec. 8, 2022.

(51) Int. Cl.
| | |
|---|---|
| *H01L 23/528* | (2006.01) |
| *H01L 21/311* | (2006.01) |
| *H01L 21/768* | (2006.01) |
| *H01L 23/522* | (2006.01) |

(52) U.S. Cl.
CPC ...... *H01L 23/528* (2013.01); *H01L 21/31116* (2013.01); *H01L 21/76816* (2013.01); *H01L 21/76877* (2013.01); *H01L 23/5226* (2013.01)

(58) Field of Classification Search
CPC .............. H10D 84/0149; H01L 23/528; H01L 21/76897; H01L 21/76804; H01L 21/76895; H01L 21/76802; H01L 21/76831; H01L 21/76834; H01L 21/76843; H01L 21/76877; H01L 21/76816; H01L 21/76805; H01L 21/76814
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Zandra V Smith
*Assistant Examiner* — John M Parker
(74) *Attorney, Agent, or Firm* — JCIPRNET

(57) ABSTRACT

A method of forming a semiconductor device includes the following operations. A substrate is provided with an electric component. A composite dielectric layer is formed on the substrate and covers the electric component. An opening is formed through the composite dielectric layer. A directional etching process is performed to widen an upper portion of the opening. A metal feature is formed in the opening.

20 Claims, 24 Drawing Sheets

(56) References Cited

U.S. PATENT DOCUMENTS

| | | | |
|---|---|---|---|
| 9,520,482 B1 | 12/2016 | Chang et al. | |
| 9,576,814 B2 | 2/2017 | Wu et al. | |
| 10,483,398 B2* | 11/2019 | Chang | H10D 64/511 |
| 10,510,666 B2* | 12/2019 | Sung | H01L 23/5283 |
| 2002/0020835 A1* | 2/2002 | Gonzalez | H01L 21/76877 |
| | | | 257/E21.585 |
| 2008/0067678 A1* | 3/2008 | Kim | H01L 21/76801 |
| | | | 438/618 |
| 2009/0145877 A1* | 6/2009 | Chang | H01L 21/31144 |
| | | | 216/13 |
| 2015/0380303 A1* | 12/2015 | Yang | H01L 21/76802 |
| | | | 438/666 |
| 2016/0365271 A1* | 12/2016 | Chang | H01L 21/76831 |
| 2017/0221812 A1* | 8/2017 | Chang | H01L 21/76813 |
| 2020/0105519 A1* | 4/2020 | Lin | H01L 21/285 |
| 2020/0411369 A1* | 12/2020 | Yang | H01L 21/0337 |

* cited by examiner

SEMICONDUCTOR DEVICES AND METHODS OF FORMING THE SAME

CROSS-REFERENCE TO RELATED APPLICATION

This application claims the priority benefit of U.S. provisional application Ser. No. 63/431,300, filed on Dec. 8, 2022. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Although the existing semiconductor devices or semiconductor packages have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
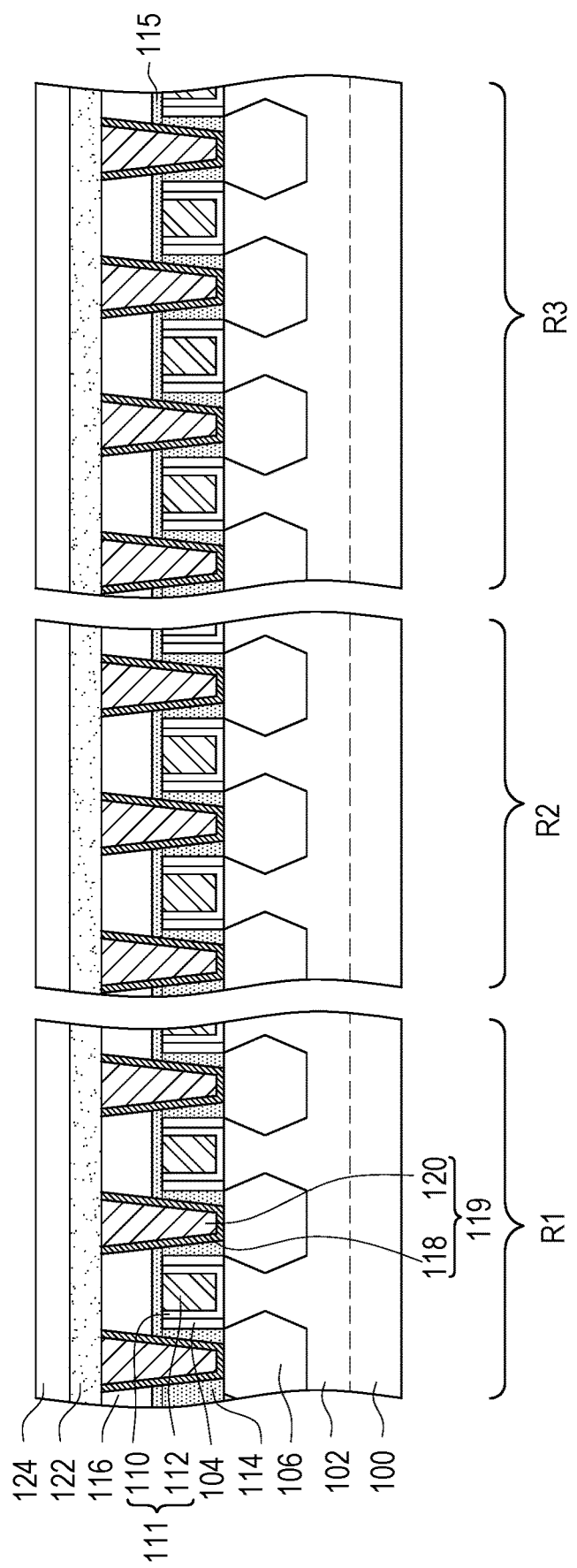
FIG. 1A to FIG. 9 illustrate varying views of forming a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments of the present disclosure, with an ex-situ directional etching process, the upper portion of an opening and therefore the upper part of a metal feature (e.g., metal contact/via, power rail contact, etc.) are widened to increase the contact area with the overlying metal line, while the lower portion of the opening and therefore the lower part of the metal feature maintain substantially unchanged to meet the time dependent dielectric breakdown (TDDB) window requirements. Therefore, the semiconductor structure is formed with lower contact resistance, higher speed and improved reliability.

FIG. 1A to FIG. 9 illustrate varying views of forming a semiconductor device according to some embodiments of the present disclosure. FIG. 1A, FIG. 2A, FIG. 3A, FIG. 4A, FIG. 5A, FIG. 6A, FIG. 7A, FIG. 8A and FIG. 9 are schematic cross-sectional views at different forming stages. FIG. 1B, FIG. 2B, FIG. 3B, FIG. 4B, FIG. 5B, FIG. 6B, FIG. 7B and FIG. 8B are simplified top views at different forming stages, in which only metal contacts and adjacent layers are shown for clarity of illustration.

Referring to FIG. 1A, a substrate 100 is provided. The substrate 100 may be a semiconductor substrate, such as a bulk semiconductor substrate, a semiconductor-on-insulator (SOI) substrate, or the like. Other substrates, such as a multi-layered or a gradient substrate, may also be used. Depending on the requirements of design, the substrate 100 may be a P-type substrate or an N-type substrate and may have doped regions therein. The doped regions may be configured for N-type devices or P-type devices. The following embodiments in which the devices are fin field-effect transistor (FinFET) devices are provided for illustration purposes, and are not construed as limiting the present disclosure. The devices may be planar metal-oxide-semiconductor field-effect transistor (MOSFET) devices, Gate All Around (GAA) transistor devices or other suitable devices.

In some embodiments, the substrate 100 has three regions R1, R2 and R3 adjacent to each other. The regions R1, R2 and R3 are all active regions. The regions R1, R2 and R3 are divided for illustration purposes. For example, the subsequently formed metal features (e.g., metal contacts/vias, power rail contacts, etc.) electrically connected to different underlying electric components (e.g., gate electrodes, strained layers, etc.) are formed in different regions R1, R2 and R3.

In some embodiments, the substrate 100 is provided with one or more fins 102. The substrate 100 and fins 102 include an elementary semiconductor such as silicon or germanium, a compound semiconductor such as SiC or SiGe, the like, or a combination thereof. The substrate 100 and fins 102 are made by the same material or different materials. Depending on the requirements of design, the substrate 100 may be a P-type substrate or an N-type substrate and may have doped regions therein. The doped regions may be configured for an N-type device or a P-type device. In some embodiments, the substrate 100 has an isolation layer formed thereon. Specifically, the isolation layer covers lower portions of the fins 102 and exposes upper portions of the fins 102. In some embodiments, the isolation layer is a shallow trench isolation (STI) structure.

In some embodiments, in each of the regions R1, R2 and R3, the substrate 100 has multiple gate stacks 111 formed thereon, spacers 104 formed on the sidewalls of the gate stacks 111, strained layers 106 formed therein, and a dielectric layer 114 formed over the gate stacks 111 and the strained layers 106. In some embodiments, the method of forming the structure of FIG. 1A includes forming dummy gate stacks across the fins 102, forming spacers 104 on the sidewalls of the dummy gate stacks, forming strained layers 106 at two sides of each fin 102, forming a dielectric layer 114 aside the dummy gate stacks and over the strained layers 106, and replacing the dummy gate stacks with gate stacks 111.

In some embodiments, each of the gate stacks 111 includes a gate dielectric layer 110 and a gate electrode 112 on the gate dielectric layer 110. In some embodiments, the gate stacks 111 extend in a direction different from (e.g., perpendicular to) the extending direction of the fins 102. In some embodiments, the gate dielectric layer 110 includes a high-k material such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In some embodiments, the gate electrode 112 includes a work function metal layer and an overlying fill metal layer. The work function metal layer is a P-type work function metal layer or an N-type work function metal layer. The P-type work function metal layer includes TiN, WN, TaN, the like, or a combination thereof. The N-type work function metal layer includes TiAl, TiAlN, TaCN, the like, or a combination thereof. The fill metal layer includes copper (Cu), aluminum (Al), tungsten (W), the like, or a combination thereof. The adjacent gate stacks 111 may include the same or different work function metal layers. In some embodiments, each of the gate dielectric layers 110 surrounds the sidewall and bottom of the corresponding gate electrode 112 and on the top and sidewall of each fin 102, as shown in FIG. 1A. In some embodiments, an interfacial layer such as a silicon oxide layer is formed between the gate dielectric layer 110 and each fin 102.

In some embodiments, the top surfaces of the spacers 104 are flushed with the top surfaces of the gate stacks 111. However, the present disclosure is not limited thereto. In other embodiments, the top surfaces of the spacers 104 are higher than the top surfaces of the gate stacks 111, and a T-shaped dielectric cap is formed over two spacers 104 and a gate stack 111 between the two spacers 104. The T-shaped dielectric cap may include silicon oxide, silicon nitride, metal oxide (e.g., $AlO_x$, $TiO_x$, $ZnO_x$, $MnO_x$ etc.) or the like, The spacers 104 may have a single-layer structure or a multi-layer structure. In some embodiments, the spacers 104 have a dielectric constant less than about 10, or even less than about 5. The spacers 104 may include silicon oxide, silicon nitride, silicon carbide, silicon carbide nitride, silicon oxide carbide, silicon carbide oxynitride, the like, or a combination thereof.

In some embodiments, the strained layers 106 include silicon germanium (SiGe) for a P-type device. In other embodiments, the strained layers 106 include silicon carbon (SiC), silicon phosphate (SiP), SiCP or a SiC/SiP multi-layer structure for an N-type device. In some embodiments, the strained layers 106 may be optionally implanted with an N-type dopant or a P-type dopant as needed. In some embodiments, the adjacent strained layers 106 at the same side are separate from each other. In other embodiments, the adjacent strained layers 106 at the same side are connected with one another. In some embodiments, the method of forming the strained layers 106 includes forming recesses in the fins 102, and growing epitaxial layers from the recesses. The strained layers 106 are referred to as "epitaxial layers" or "source/drain regions" in some examples. Source/drain region(s) may refer to a source or a drain, individually or collectively dependent upon the context. In some embodiments, the strained layers 106 may be shaped as any suitable shape. For example, as shown in FIG. 1A, each strained layer 106 is shaped as a diamond. Following the formation of the strained layers 106, silicide regions may be formed by siliciding the top portions of the strained layers 106.

In some embodiment, the dielectric layer 114 is formed over the substrate 100 around the gate stacks 111. The dielectric layer 114 may have a single-layer structure or a multi-layer structure. In some embodiments, the dielectric layer 114 includes a contact etch stop layer conformally formed along the sidewalls and tops of the gate stacks 111 and on the tops of the strained layers 106, and a zeroth dielectric layer filling in gaps between the gate stacks 111. In some embodiments, the contact etch stop layer includes SiN, SiC, SiOC, SiON, SiCN, SiOCN, metal oxide (e.g., $AlO_x$, $TiO_x$, $ZnO_x$, $MnO_x$ etc.), metal nitride (e.g., $AlN_x$), metal oxynitride (e.g., $AlO_xN_y$, $TiO_xN_y$ etc.), the like, or a combination thereof. In some embodiments, the zeroth dielectric layer includes nitride such as $SiO_x$, SiN, SiC, SiOC, SiON, SiCN, SiOCN, a low-k material having a dielectric constant less than 3.5, the like, or a combination thereof. The dielectric layer 114 may be formed by a deposition process (e.g., CVD or ALD). The dielectric layer 114 is referred to as a "contact etch stop layer (CESL)" or a "zeroth dielectric layer" in some examples.

Still referring to FIG. 1A, a mask layer 115 is formed on the dielectric layer 114 and the gate stacks 111. Specifically, the mask layer 115 is in contact with the gate stacks 111 and the spacers 104 and functions as an etching stop layer. In some embodiments, the mask layer 115 includes SiN, SiC, SiOC, SiON, SiCN, SiOCN, metal oxide (e.g., $AlO_x$, $TiO_x$, $ZnO_x$, $MnO_x$ etc.), metal nitride (e.g., $AlN_x$), metal oxynitride (e.g., $AlO_xN_y$, $TiO_xN_y$ etc.), the like, or a combination thereof. The mask layer 115 may be formed by a deposition process (e.g., CVD or ALD). The mask layer 115 is referred to as a "contact etch stop layer (CESL)" in some examples.

Thereafter, a dielectric layer 116 is formed on the mask layer 115. In some embodiments, the dielectric layer 116 includes $SiO_x$, SiN, SiC, SiOC, SiON, SiCN, SiOCN, a low-k material having a dielectric constant less than 3.5, the like, or a combination thereof. The dielectric layer 116 may be formed by a deposition process (e.g., CVD or ALD). The dielectric layer 116 is referred to as a "first dielectric layer" in some examples.

Afterwards, metal contacts 119 are formed through the dielectric layer 116, the mask layer 115 and the dielectric layer 114 and in contact with the strained layers 106. In some embodiments, the method of forming the metal contacts 119 includes forming contact openings through the dielectric layer 116, the mask layer 115 and the dielectric layer 114 by photolithography and etching process, forming metal materials in the contact openings by deposition processes (e.g., PVD, CVD and/or ALD), and removing the metal materials outside of the contact openings by a planarization process (e.g., CMP). In some embodiments, each of the metal contacts 119 includes a metal layer 120 and a metal liner layer 118 surrounds the sidewall and bottom of the metal layer 120. In some embodiments, the metal liner layer 118 includes a seed layer and/or a barrier layer. The seed layer may include Ti/Cu. The barrier layer may include Ta, TaN, Ti, TiN, CoW or a combination thereof. The metal layer 120 may include Cu, Al, Ti, Ta, W, Mo, Ru, Co, Ni, the like, or a combination thereof. In some embodiments, the metal contacts 119 are separated from the gate stacks 111 by the dielectric layer 114, the mask layer 115 and the spacers 104. In some embodiments, the top surfaces of the metal contacts 119 are substantially flushed with the top surface of the dielectric layer 116. In some embodiments, the metal contacts 119 have inclined sidewalls. However, the present disclosure is not limited thereto. In other embodiments, the metal contacts 119 have substantially vertical sidewalls. The metal contacts 119 are referred to as "source/drain contacts" in some examples.

Still referring to FIG. 1A, a shielding layer 122 is formed over the substrate 100 across the regions R1, R2 and R3. In some embodiments, the shielding layer 122 includes SiN, SiC, SiOC, SiON, SiCN, SiOCN, metal oxide (e.g., $AlO_x$, $TiO_x$, $ZnO_x$, $MnO_x$ etc.), metal nitride (e.g., $AlN_x$), metal oxynitride (e.g., $AlO_xN_y$, $TiO_xN_y$ etc.), the like, or a combination thereof. The shielding layer 122 may be formed by a deposition process (e.g., CVD or ALD).

Thereafter, a dielectric layer 124 is formed over the shielding layer 122. In some embodiments, the dielectric layer 124 includes $SiO_x$, SiN, SiC, SiOC, SiON, SiCN, SiOCN, a low-k material having a dielectric constant less than 3.5, the like, or a combination thereof. The dielectric layer 124 may be formed by a deposition process (e.g., CVD or ALD). As shown in the top view of FIG. 1B, the dielectric layer 124 is formed across the regions R1, R2 and R3.

In some embodiments, the shielding layer 122 and the dielectric layer 124 are formed with different etch selectivities. An etch selectivity is the ratio of etch rates between materials. In some embodiments, the etch selectivity of the dielectric layer 124 with respect to the shielding layer is greater than 10 or more. The shielding layer 122 is referred to as an "etch stop layer", and the dielectric layer 124 is referred to as a "second dielectric layer" in some examples. In some embodiments, the shielding layer 122 and the dielectric layer 124 are collectively called a "composite dielectric layer".

Figure 2A:
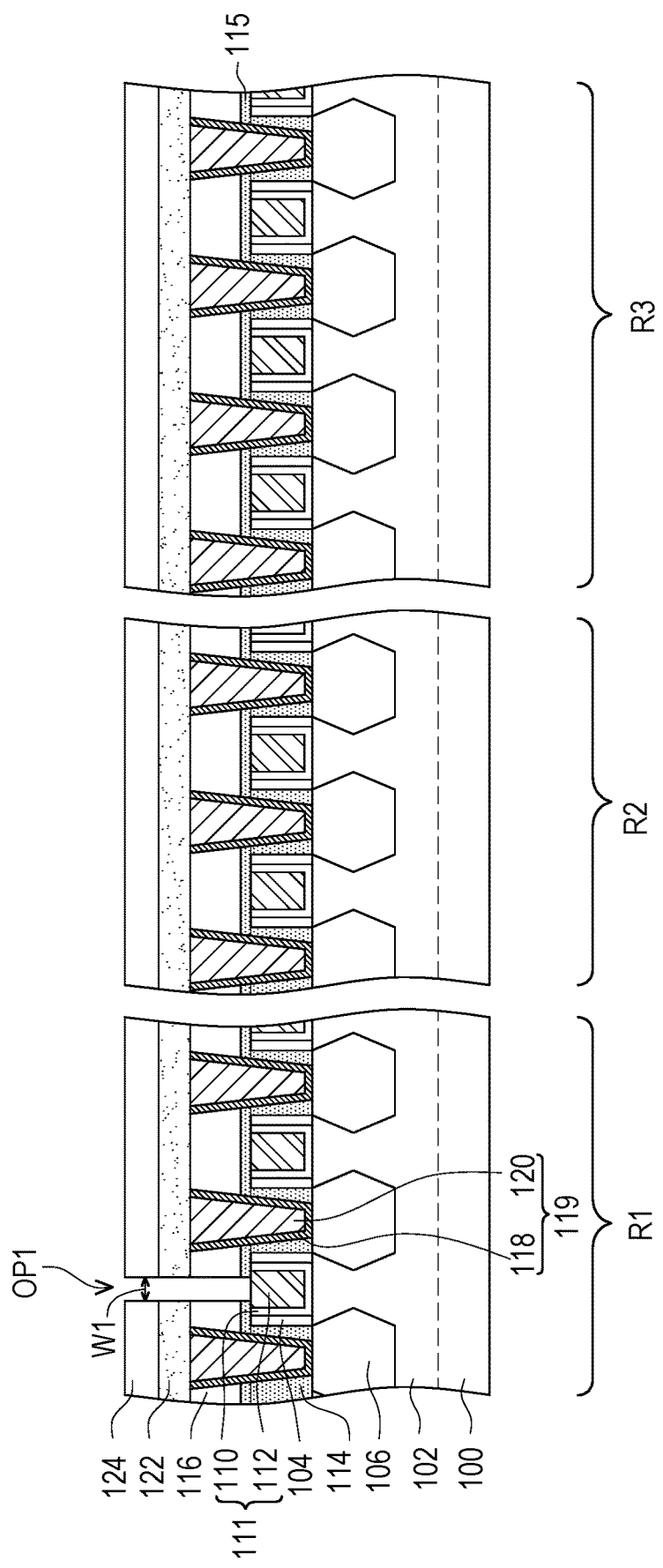
Figure 2B:
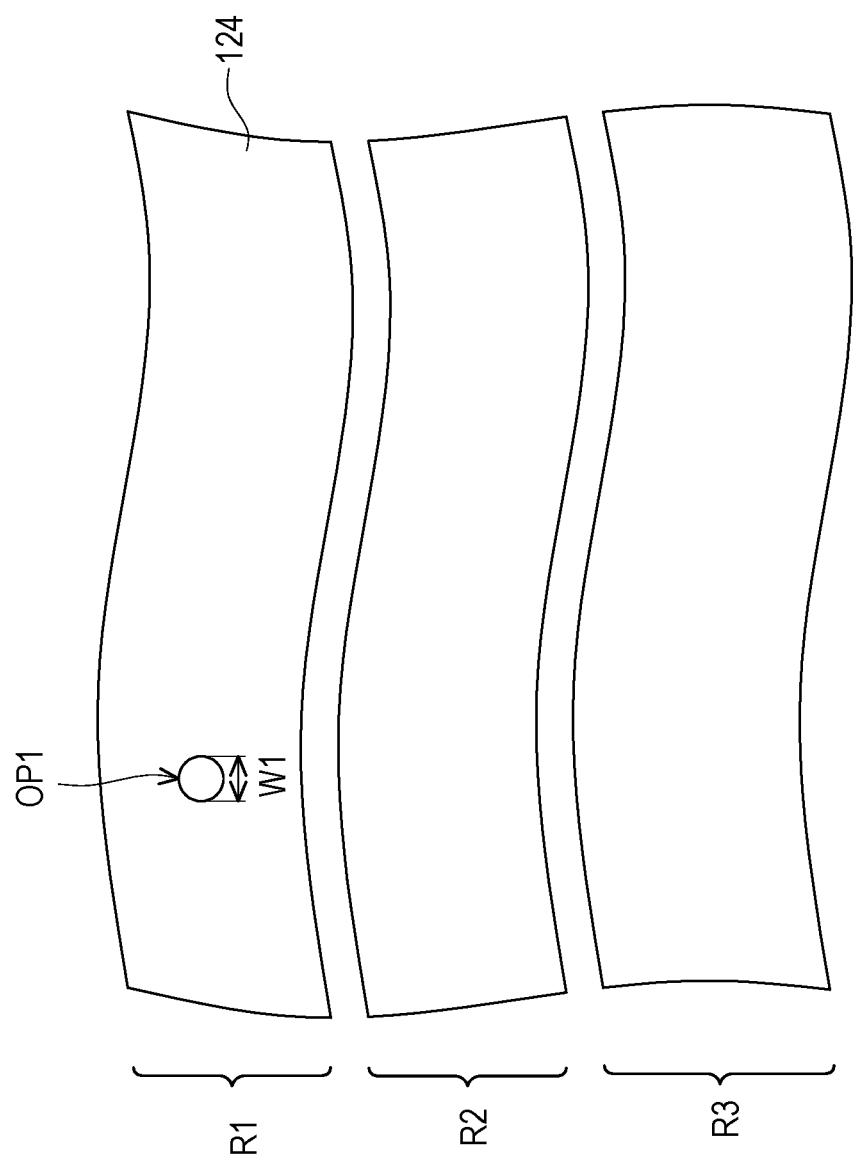

Referring to FIG. 2A and FIG. 2B, an opening OP1 is formed through the dielectric layer 124, the shielding layer 122, the dielectric layer 116 and the mask layer 115, and therefore exposes the gate electrode 112 of the corresponding gate stack 111 in the region R1. In some embodiments, the method of forming the opening OP1 includes performing lithography and etching processes. Specifically, a photoresist layer is formed over the substrate 100 exposing an intended location in the region R1 while covering the regions R2 and R3, and an etching process is performed to the exposed layers by using the photoresist layer as an etching mask. In some embodiments, the etching gas for forming the opening OP1 includes $CH_3F$, $CH_2F_2$, $CHF_3$, $CH_4$, $CF_4$, $C_4F_8$, $C_4F_6$, $N_2$, $O_2$, Ar, the like, or a combination thereof. In some embodiments, the opening OP1 has a circle-like shape from a top view, as shown in FIG. 2B. In some embodiments, the opening OP1 has a dimension W1. In some embodiments, the opening OP1 has a substantially vertical sidewall. However, the present disclosure is not limited thereto. In other embodiments, the opening OP1 has an inclined sidewall. The opening OP1 is referred to as a "first opening" or a "gate contact opening" in some examples.

Figure 3A:
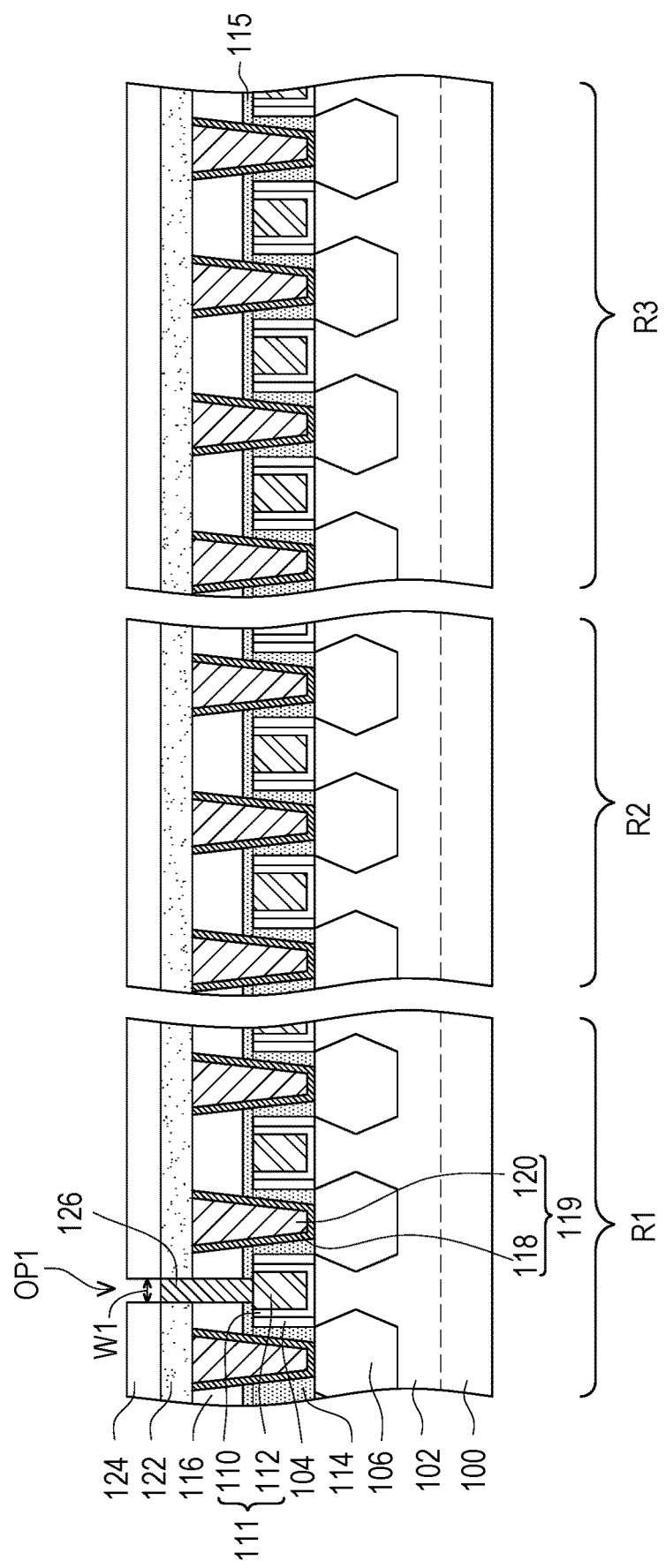
Figure 3B:
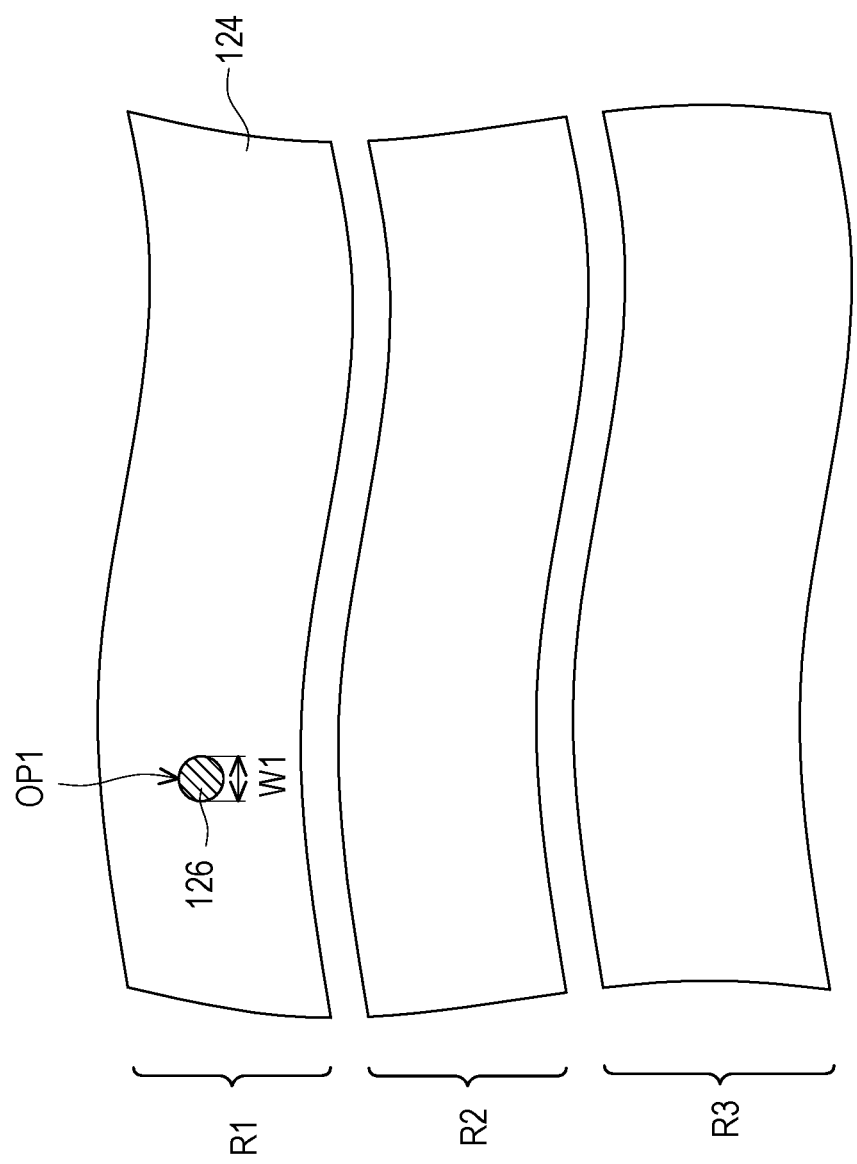

Referring to FIG. 3A and FIG. 3B, a metal layer 126 is formed in the lower portion of the opening OP1. In some embodiments, metal materials are formed over the substrate 100 across the regions R1, R2 and R3 filling in the opening OP1, and excess metal materials outside of the opening OP1 are removed by a chemical mechanical polishing process followed by an etching back process. In some embodiments, the metal materials includes a metal layer and a metal liner layer surrounds the sidewall and bottom of the metal layer. In some embodiments, the metal liner layer includes a seed layer and/or a barrier layer. The seed layer may include Ti/Cu. The barrier layer may include Ta, TaN, Ti, TiN, CoW or a combination thereof. The metal layer may include Cu, Al, Ti, Ta, W, Mo, Ru, Co, Ni, the like, or a combination thereof. In some embodiments, the top surface of the metal layer 126 is substantially flushed with the interface between the shielding layer 122 and the dielectric layer 124. However, the present disclosure is not limited to. In other embodiments, the top surface of the metal layer 126 may be higher than or lower than the interface between the shielding layer 122 and the dielectric layer 124.

Figure 4A:
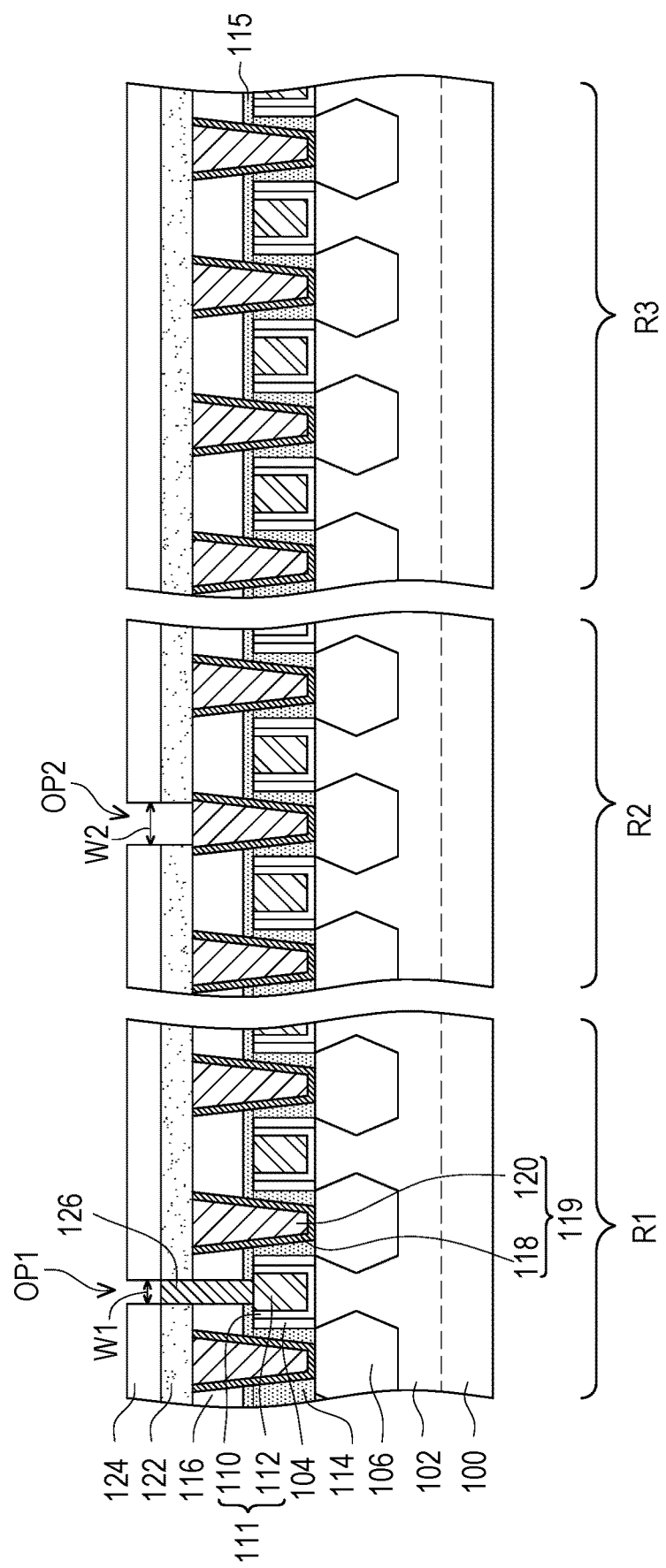
Figure 4B:
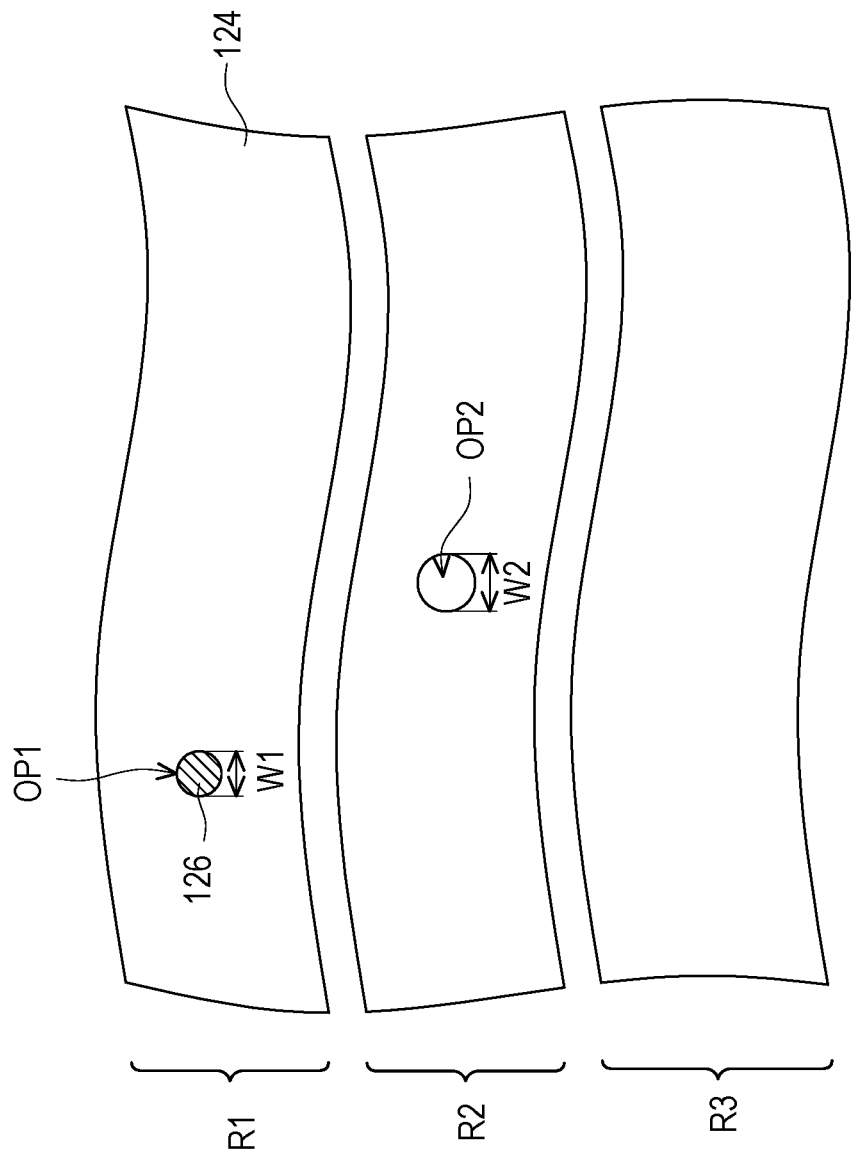

Referring to FIG. 4A and FIG. 4B, an opening OP2 is formed through the dielectric layer 124 and the shielding layer 122 and therefore exposes the corresponding metal contact 119 in the region R2. In some embodiments, the method of forming the opening OP2 includes performing lithography and etching processes. Specifically, a photoresist layer is formed over the substrate 100 exposing an intended location in the region R2 while covering the regions R1 and R3, and an etching process is performed to the exposed layers by using the photoresist layer as an etching mask. In some embodiments, the etching gas for forming the opening OP2 includes $CH_3F$, $CH_2F_2$, $CHF_3$, $CH_4$, $CF_4$, $C_4F_8$, $C_4F_6$, $N_2$, $O_2$, Ar, the like, or a combination thereof. In some embodiments, the opening OP2 has a circle-like shape from a top view, as shown in FIG. 4B. In some embodiments, the opening OP2 has a dimension W2. In some embodiments, the opening OP2 has a substantially vertical sidewall. However, the present disclosure is not limited thereto. In other embodiments, the opening OP2 has an inclined sidewall. The opening OP2 is referred to as a "second opening" or a "source/drain contact opening" in some examples.

In some embodiments, the opening OP2 is different from (e.g., greater than) the opening OP1, as shown in FIG. 4A. However, the present disclosure is not limited thereto. In other embodiments, the opening OP2 is as wide as or narrower than the opening OP1. In some embodiments, the aspect ratio of the opening OP2 is less than the aspect ratio of the opening OP1. However, the present disclosure is not limited thereto. In other embodiments, the aspect ratio of the opening OP2 is substantially the same as or greater than the aspect ratio of the opening OP1.

In some embodiments, the opening OP2 and the opening OP1 are formed separately at different etching stages. However, the present disclosure is not limited thereto. In other embodiments, the opening OP2 and the opening OP1 are formed simultaneously at the same etching stage.

Figure 5A:
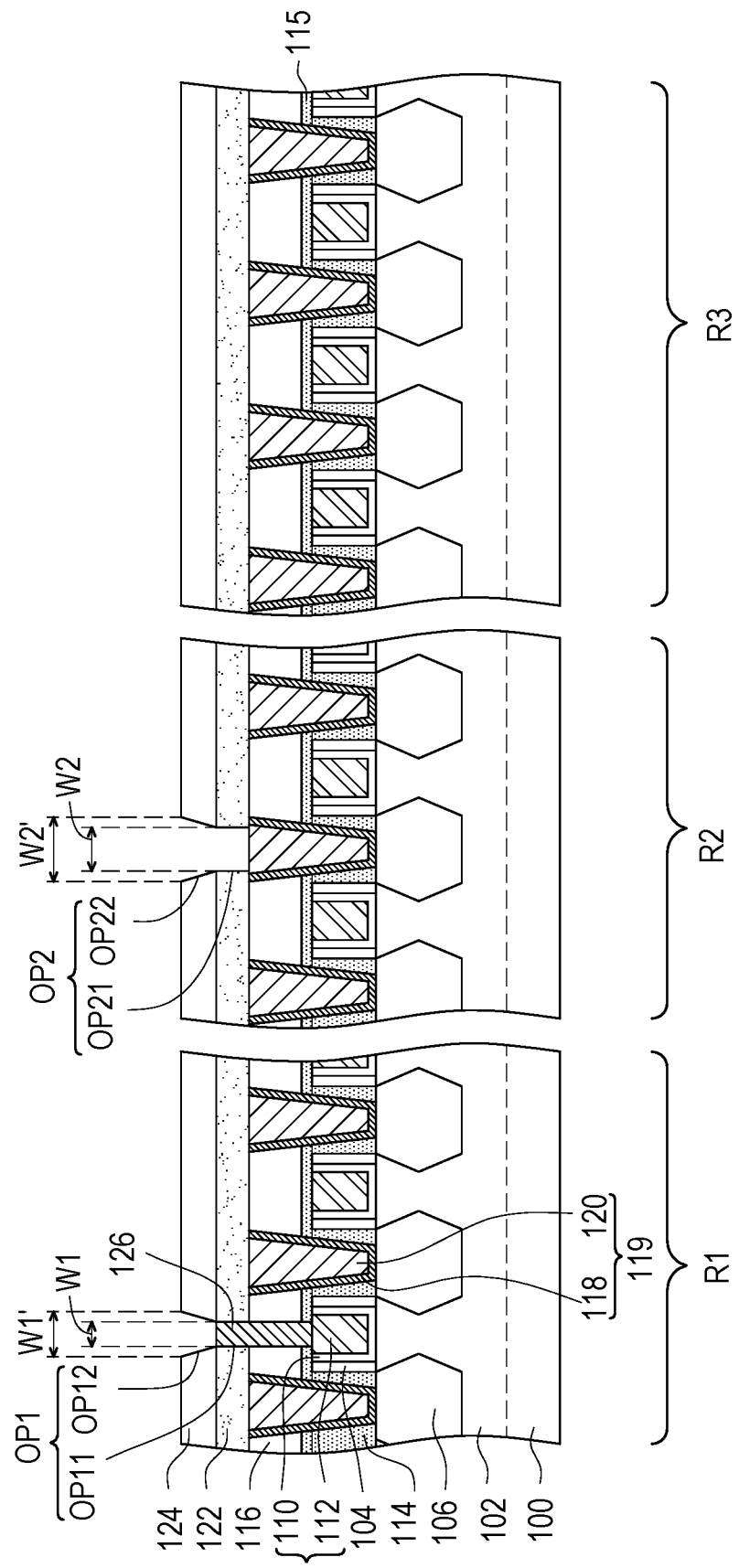
Figure 5B:
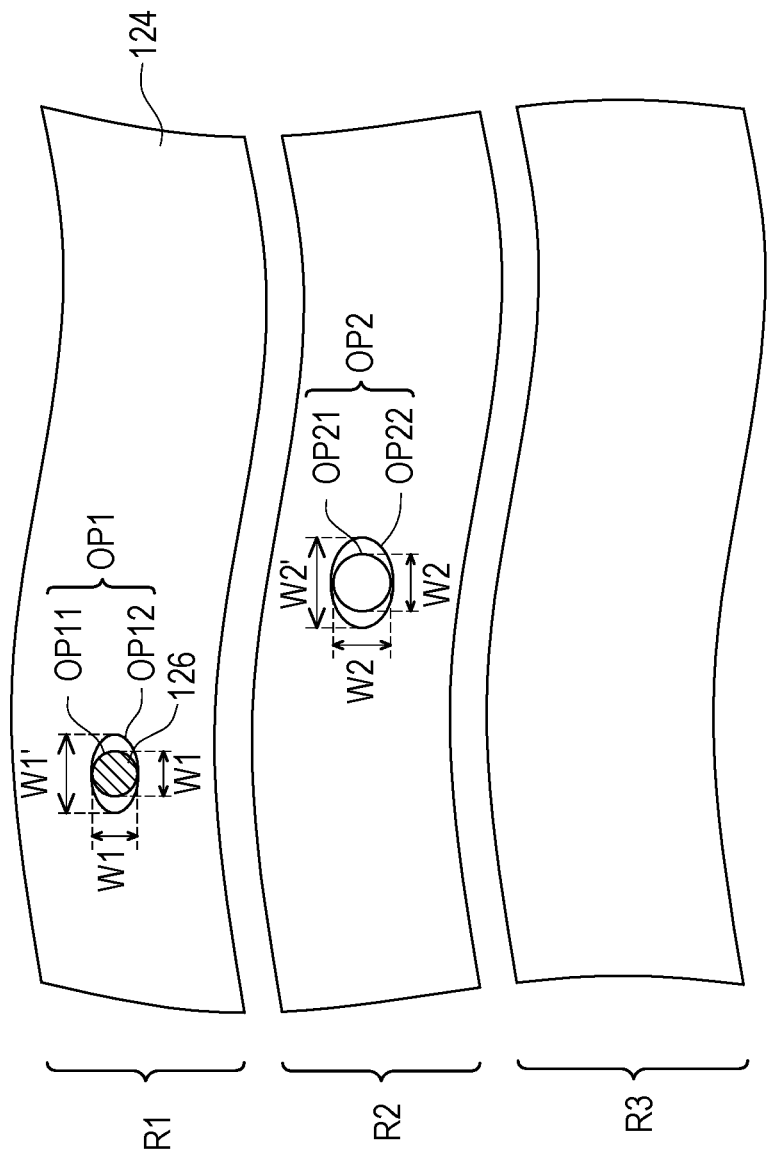

Referring to FIG. 5A and FIG. 5B, a directional etching process is performed to the openings OP1 and OP2 to widen upper portions of the openings OP1 and OP2. In the directional etching process, only one dimension (e.g., X-direction dimension or length) of the opening is increased, while other dimensions (e.g., Y-direction dimension or width, and Z-direction dimension or depth) of the opening maintain substantially unchanged or the change in these dimensions of the opening is less than about 10%, 5% or 3%. In some embodiments, the ratio of the push amount of the X-direction dimension with respect to the push amount of the Y-direction dimension is about 10, 15 or more. For example, the change in the X-direction dimension is about 5 nm, 10 nm or more, while the change in the Y-direction dimension or Z-direction dimension is about 0.2 nm, 0.5 nm or less. The directional etching process is referred to as a "top critical dimension (TCD) enlarging process" in some examples.

In some embodiments, the etching gas for forming the directional etching process includes $CH_3F$, $CH_2F_2$, $CHF_3$, $CH_4$, $CF_4$, $C_4F_8$, $C_4F_6$, $N_2$, $O_2$, Ar, the like, or a combination thereof. In some embodiments, upon the directional etching process, the upper portion of each of the openings OP1 and OP2 has an oval-like shape or an elliptical-like shape from a top view, as shown in FIG. 5B. In some embodiments, upon the directional etching process, the original dimension W1 of the upper portion of the opening OP1 is widened or elongated a to a dimension W1', and the original dimension W2 of the upper portion of the opening OP2 is widened or elongated a to a dimension W2'. In some embodiments, upon the directional etching process, the upper portion OP12 of the opening OP1 has an inclined sidewall, while the lower portion OP11 of the opening OP1 has a substantially vertical sidewall. Similarly, the upper portion OP22 of the opening OP2 has an inclined sidewall, while the lower portion OP21 of the opening OP2 has a substantially vertical sidewall.

In some embodiments, as shown in FIG. 5B, the upper portion OP12 of the openings OP1 has a first length (e.g., the dimension W1') at a semi-major axis and a second length (e.g., the W1) at a semi-minor axis, the first length is greater than the second length. Similarly, the upper portion OP22 of the openings OP2 has a first length (e.g., the dimension W2') at a semi-major axis and a second length (e.g., the W2) at a semi-minor axis, the first length is greater than the second length.

The etching gases for partially widening the openings OP1 and OP2 (as shown in FIG. 5A) may be the same as the etching gases for defining the opening OP1 or OP2 (as shown in FIG. 2A or FIG. 4A), but the etching parameters and/or hardware designs may be different. For examples, the operation of partially widening the openings OP1 and OP2 (as shown in FIG. 5A) and the operation of defining the opening OP1 or OP2 (as shown in FIG. 2A or FIG. 4A) are performed in different etching chambers. The directional etching process is referred to as an "ex-situ trimming process" or an "ex-situ widening process" in some examples.

Figure 6A:
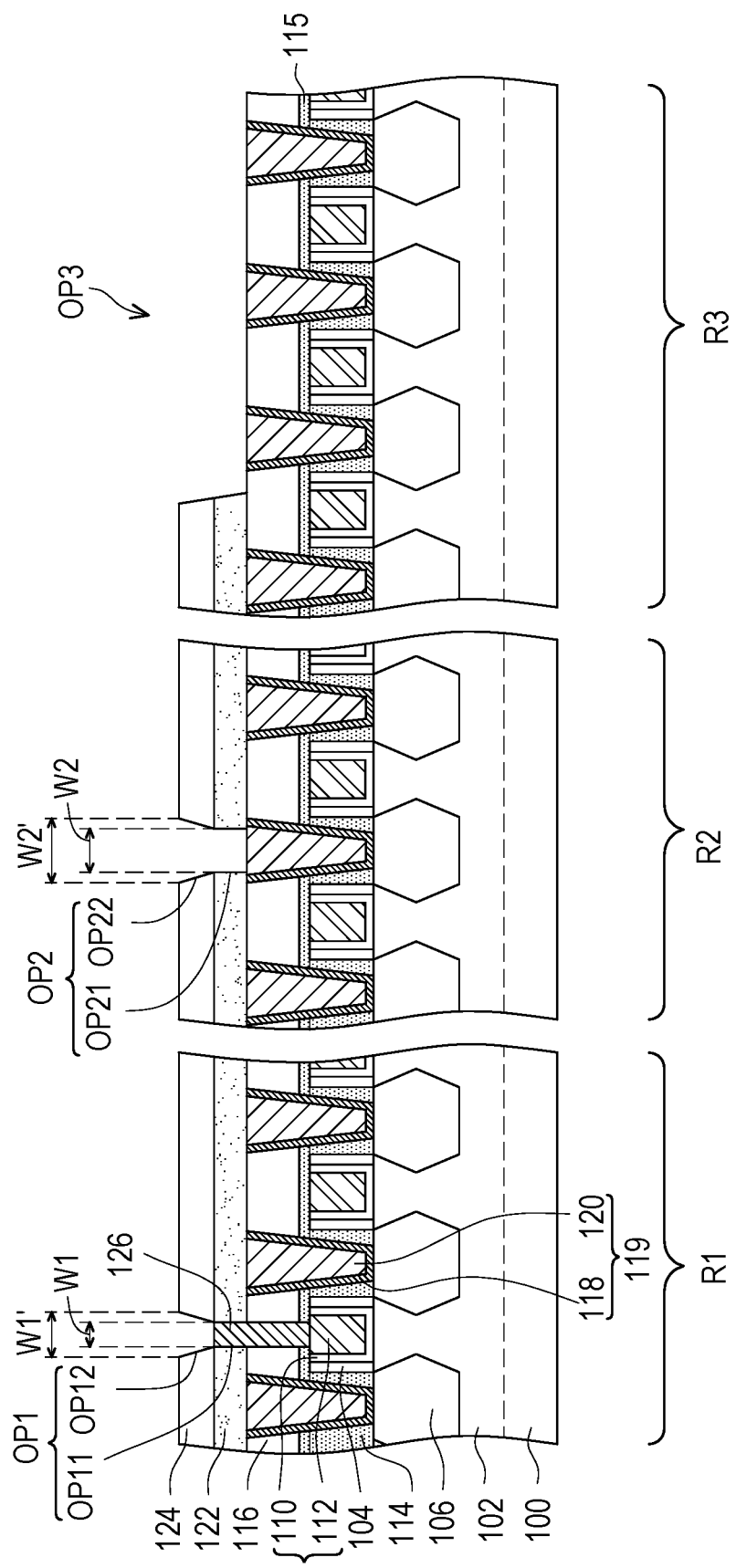
Figure 6B:
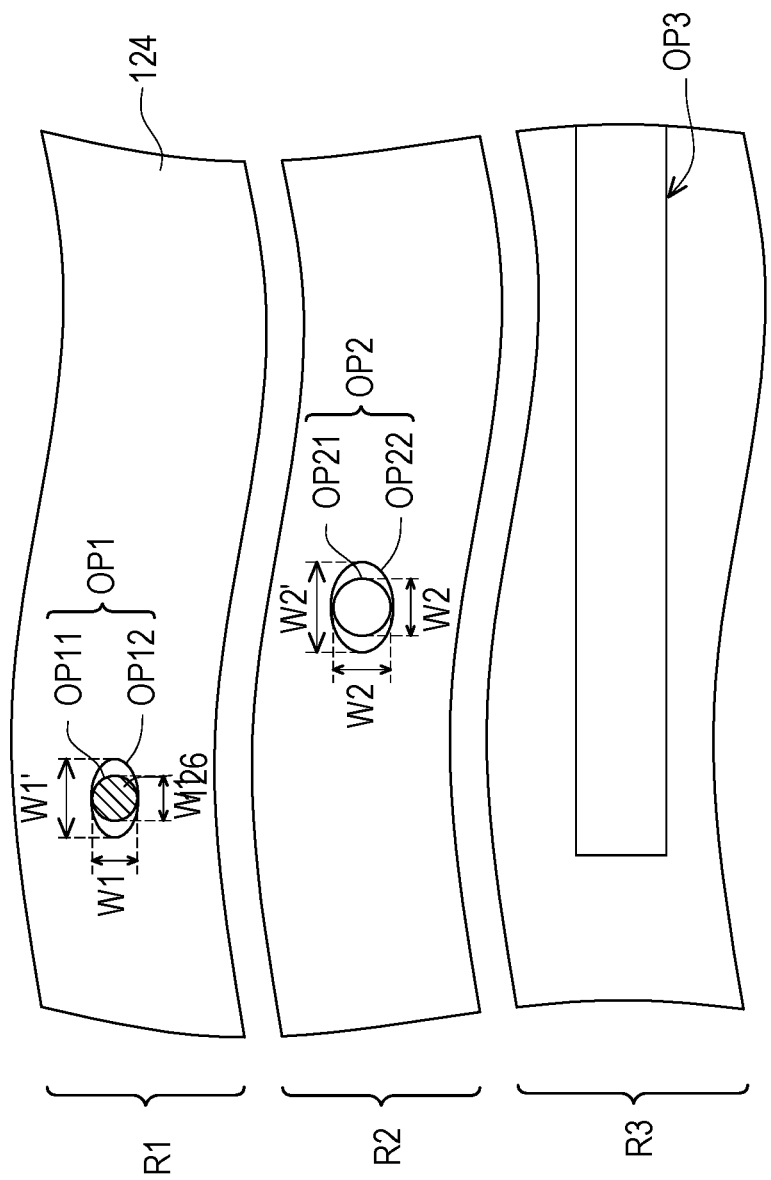

Referring to FIG. 6A and FIG. 6B, an opening OP3 is formed through the dielectric layer 124 and the shielding layer 122 and therefore exposes multiple gate stacks 111 in the region R3. In some embodiments, the method of forming the opening OP3 includes performing lithography and etching processes. Specifically, a photoresist layer is formed over the substrate 100 exposing an intended location in the region R3 while covering the regions R1 and R2, and an etching process is performed to the exposed layers by using the photoresist layer as an etching mask. In some embodiments, the etching gas for forming the opening OP3 includes $CH_3F$, $CH_2F_2$, $CHF_3$, $CH_4$, $CF_4$, $C_4F_8$, $C_4F_6$, $N_2$, $O_2$, Ar, the like, or a combination thereof. In some embodiments, the opening OP3 has a bar-like shape or a strip-like shape from a top view, as shown in FIG. 6B. In some embodiments, the opening OP3 has an inclined sidewall. However, the present disclosure is not limited thereto. In other embodiments, the opening OP3 has a substantially vertical sidewall. The opening OP3 is referred to as a "third opening" or a "power rail contact opening" in some examples.

Figure 7A:
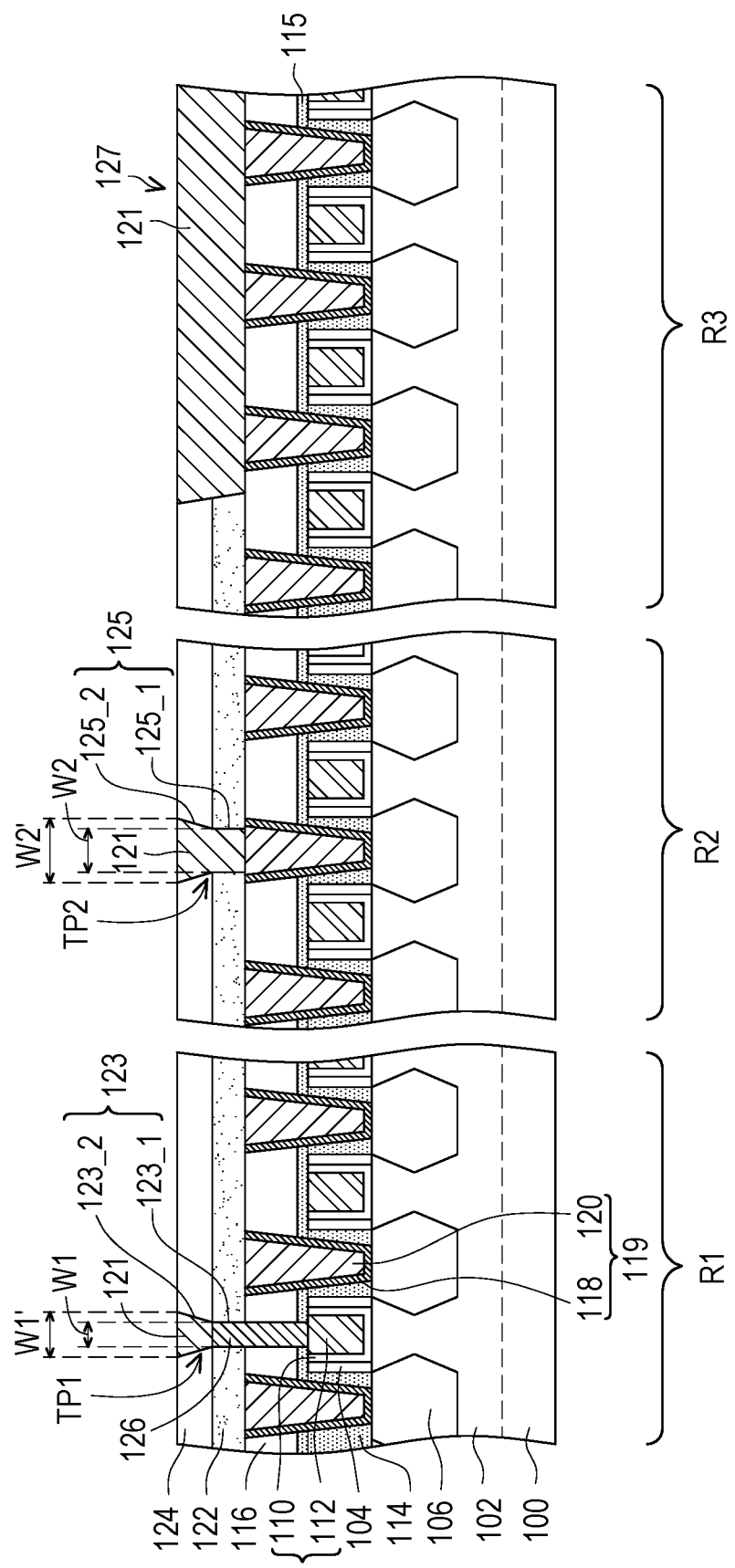
Figure 7B:
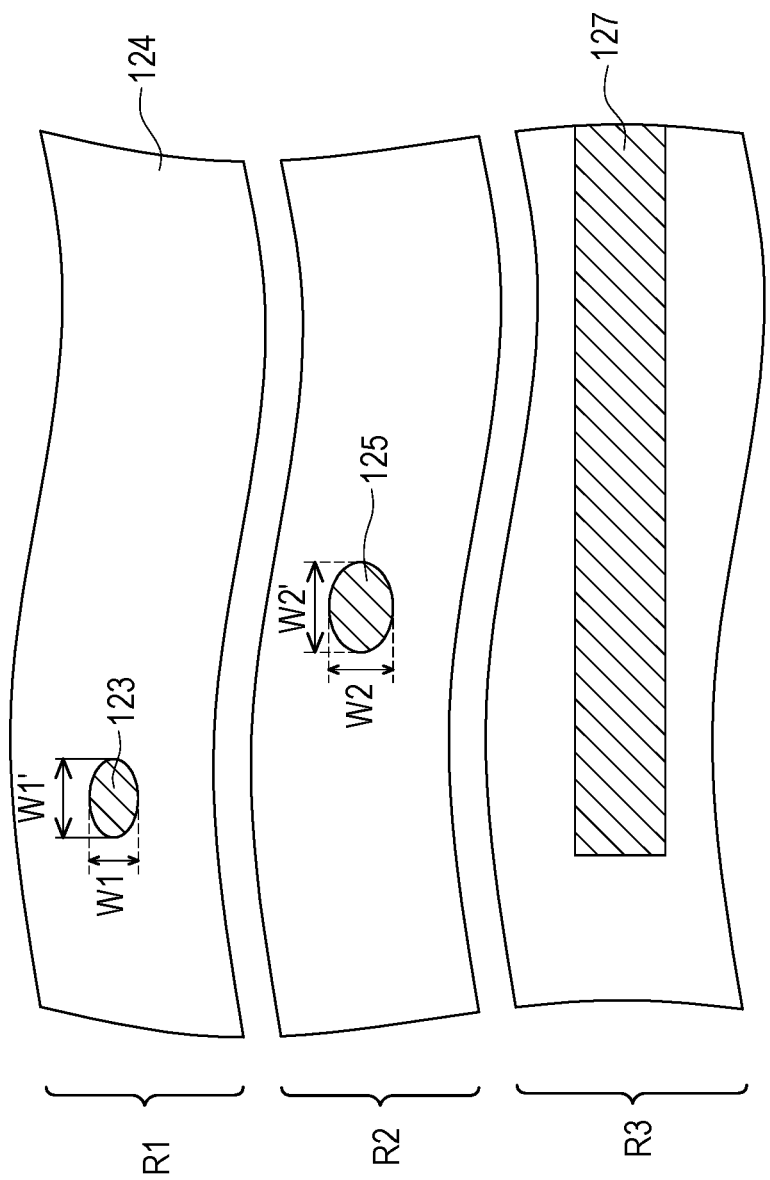

Referring to FIG. 7A and FIG. 7B, a metal layer 121 is formed in the openings OP1, OP2 and OP3. In some embodiments, metal materials are formed over the substrate 100 across the regions R1, R2 and R3 filling in the opening openings OP1, OP2 and OP3, and excess metal materials outside of the opening openings OP1, OP2 and OP3 are removed by a planarization process (e.g., CMP). In some embodiments, the metal materials includes a metal layer and a metal liner layer surrounds the sidewall and bottom of the metal layer. In some embodiments, the metal liner layer includes a seed layer and/or a barrier layer. The seed layer may include Ti/Cu. The barrier layer may include Ta, TaN, Ti, TiN, CoW or a combination thereof. The metal layer may include Cu, Al, Ti, Ta, W, Mo, Ru, Co, Ni, the like, or a combination thereof.

In some embodiments, the metal layer 121 and the underlying metal layer 126 in the opening OP1 constitute a metal contact 123 in the region R1. The interface between the metal layer 121 and the metal layer 126 may be invisible when they are made by the same material. The interface between the metal layer 121 and the metal layer 126 may be present when they are made by different materials. In some embodiments, the upper part 123_2 of the metal contact 123 has an inclined sidewall, while the lower part 123_1 of the metal contact 123 has a substantially vertical sidewall. In some embodiments, the metal contact 123 has a turning point TP1 around the interface between the shielding layer 122 and the dielectric layer 124. The metal contact 123 in the region R1 is electrically connected to the gate electrode 112. The metal contact 123 in the region R1 is referred to as a "gate contact" in some examples.

In some embodiments, the metal layer 121 in the opening OP2 constitutes a metal contact 125 in the region R2. In some embodiments, the upper part 125_2 of the metal contact 125 has an inclined sidewall, while the lower part 125_1 of the metal contact 125 has a substantially vertical sidewall. In some embodiments, the metal contact 123 has a turning point TP2 around the interface between the shielding layer 122 and the dielectric layer 124. The metal contact 125 in the region R2 is electrically connected to the strained layer 106. The metal contact 125 in the region R2 is referred to as a "source/drain contact" in some examples.

In some embodiments, as shown in FIG. 7B, the upper part 123_2 of the metal contact 123 has a first length (e.g., the dimension W1') at a semi-major axis and a second length (e.g., the W1) at a semi-minor axis, the first length is greater than the second length. Similarly, the upper part 125_2 of the metal contact 125 has a first length (e.g., the dimension W2')

at a semi-major axis and a second length (e.g., the W2) at a semi-minor axis, the first length is greater than the second length.

In some embodiments, the metal layer 121 in the opening OP3 constitutes a metal contact 127 in the region R3. In some embodiments, the metal contact 127 has an inclined sidewall. The metal contact 127 in the region R3 is electrically connected to multiple gate stacks 111. The metal contact 127 in the region R3 is referred to as a "power rail contact" in some examples. The metal contacts 123, 125 and 127 are referred to as "zeroth metal vias" in some examples.

Figure 8A:
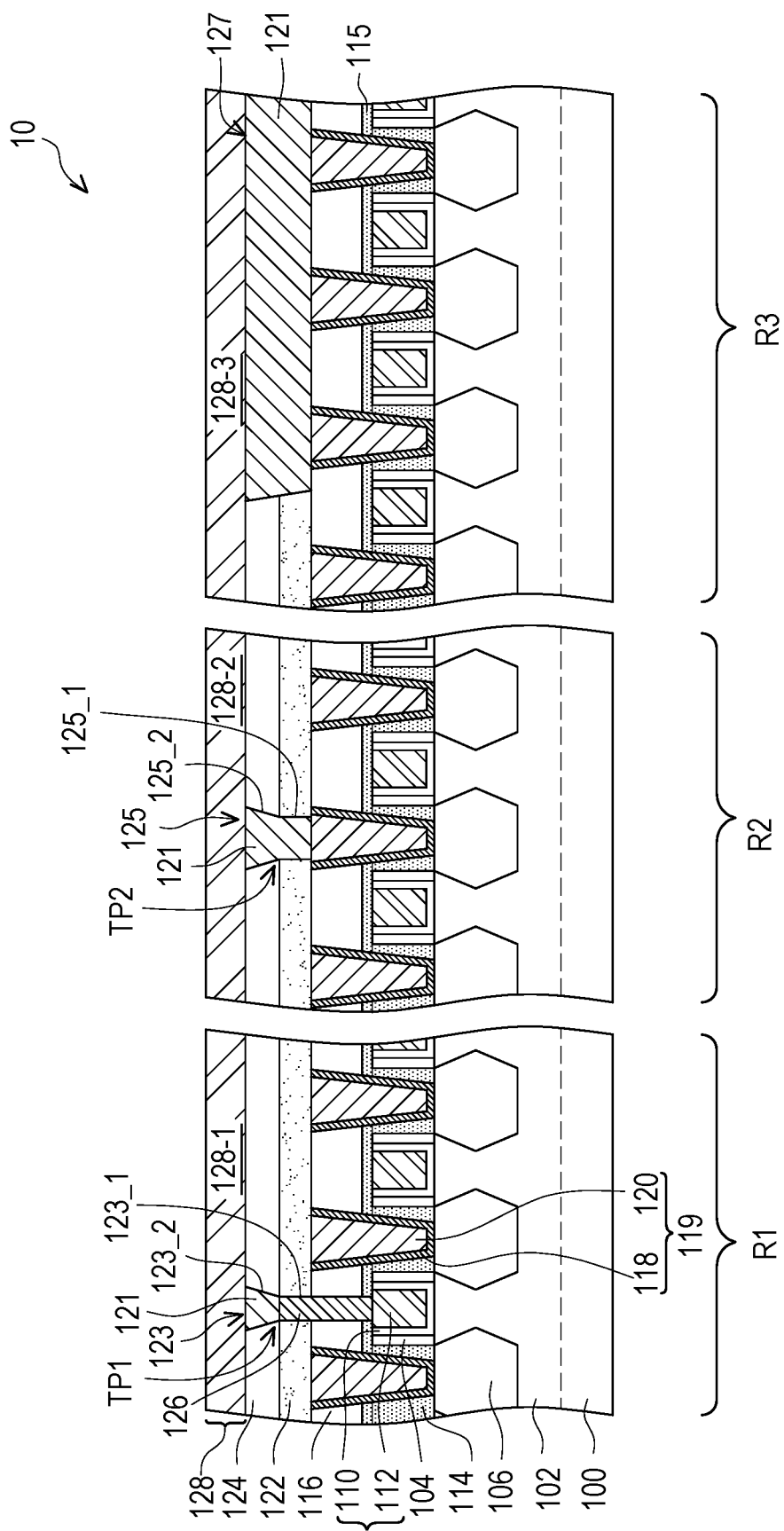
Figure 8B:
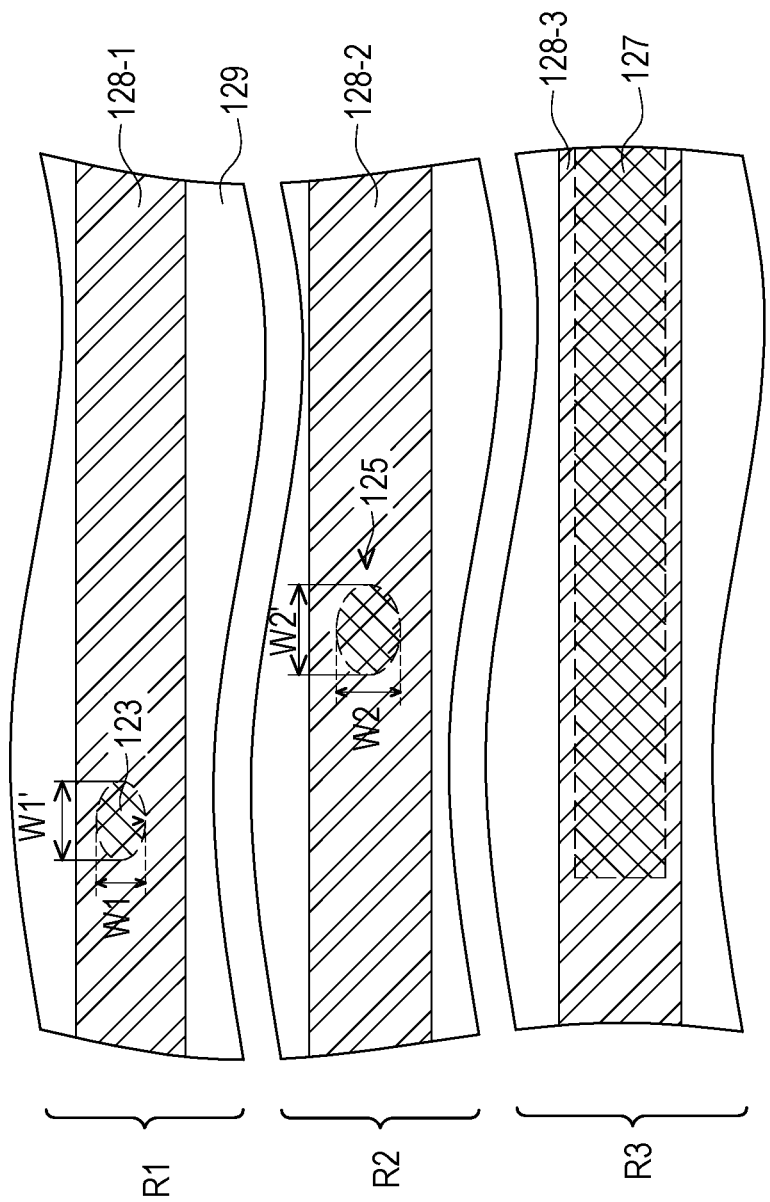

Referring to FIG. 8A and FIG. 8B, metal lines 128 are formed over the dielectric layer 124 and electrically connected to the metal contacts 123, 125 and 127. Specifically, the metal lines 128 are embedded in a dielectric layer 129 and includes a metal line 128-1 electrically connected to the metal contact 123 in the region R1, a metal line 128-2 electrically connected to the metal contact 125 in the region R2, and a metal line 128-3 electrically connected to the metal contact 127 in the region R3. The method of forming the metal lines 128 includes forming trench openings through the dielectric layer 129 by photolithography and etching process, forming metal materials in the trench openings by deposition processes (e.g., PVD, CVD and/or ALD), and removing the metal materials outside of the trench openings by a planarization process (e.g., CMP). In some embodiments, each of the metal lines 128 includes a metal layer and a metal liner layer surrounds the sidewall and bottom of the metal layer. In some embodiments, the metal liner layer includes a seed layer and/or a barrier layer. The seed layer may include Ti/Cu. The barrier layer may include Ta, TaN, Ti, TiN, CoW or a combination thereof. The metal layer may include Cu, Al, Ti, Ta, W, Mo, Ru, Co, Ni, the like, or a combination thereof. The metal lines 128 are referred to as "zeroth metal lines" in some examples. The metal contacts 123, 125, 127 and the overlying metal lines 128 are regarded as a lower interconnect structure in some examples. In some embodiments, as shown in FIG. 8B, the semi-major axes of upper parts of the metal contacts 123 and 125 extend along a direction the same as the extending direction of the metal lines 128. A semiconductor device 10 of some embodiments is thus completed.

Figure 9:
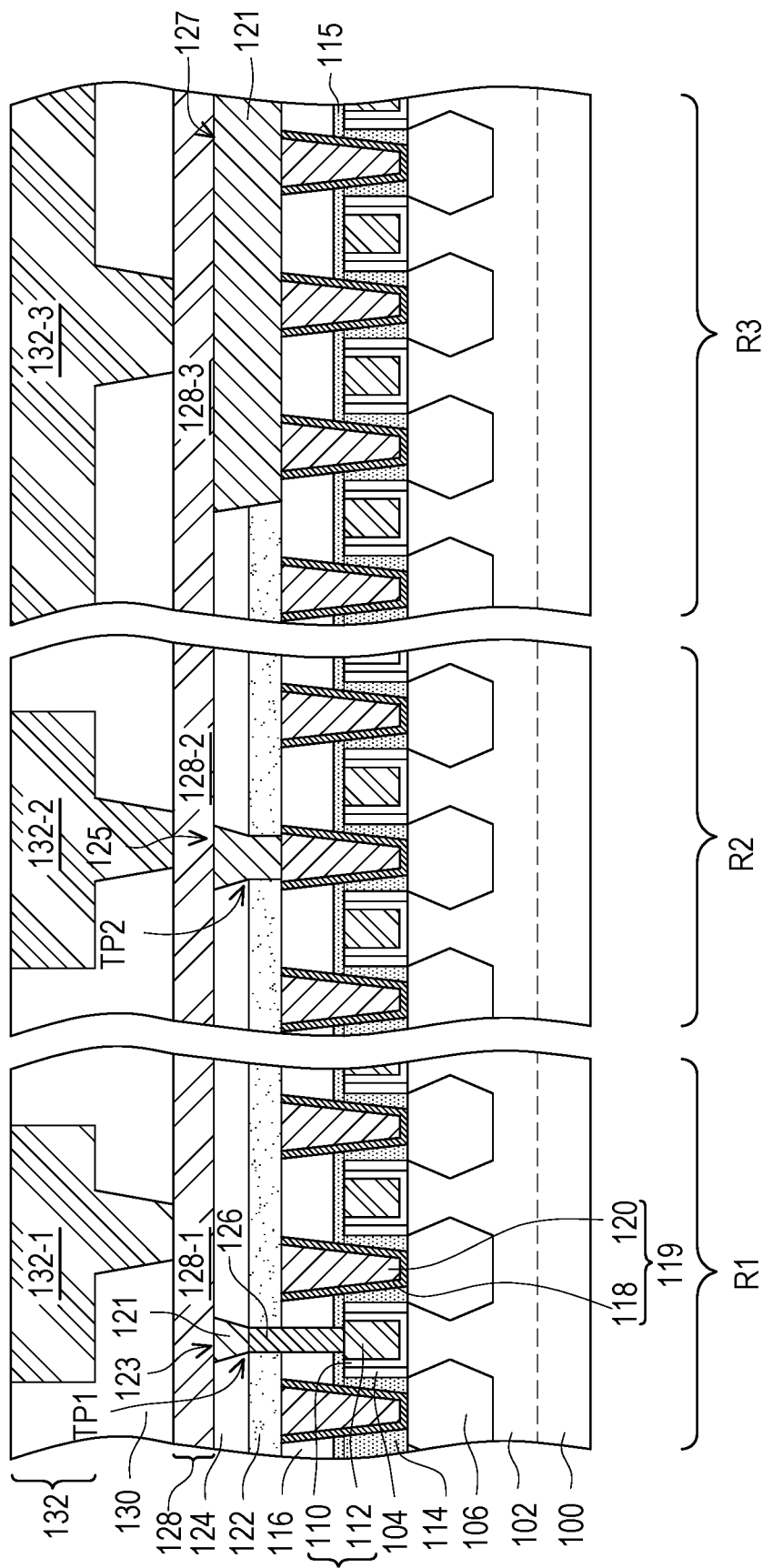

Thereafter, an upper interconnect structure is formed over and electrically connected to the lower interconnect structure, as shown in FIG. 9. In some embodiments, integrated line-and-via structures 132 are formed over the dielectric layer 129 and electrically connected to the metal lines 128. Specifically, the integrated line-and-via structures 132 are embedded in a dielectric layer 130 and includes an integrated line-and-via structure 132-1 electrically connected to the metal line 128-1 in the region R1, an integrated line-and-via structure 132-2 electrically connected to the metal line 128-2 in the region R2, and an integrated line-and-via structure 132-3 electrically connected to the metal line 128-3 in the region R3. The method of forming the integrated line-and-via structures 132 includes forming T-shaped openings or dual-damascene openings through the dielectric layer 130 by photolithography and etching process, forming metal materials in the T-shaped openings by deposition processes (e.g., PVD, CVD and/or ALD), and removing the metal materials outside of the T-shaped openings by a planarization process (e.g., CMP). In some embodiments, each of the integrated line-and-via structures 132 includes a metal layer and a metal liner layer surrounds the sidewall and bottom of the metal layer. In some embodiments, the metal liner layer includes a seed layer and/or a barrier layer. The seed layer may include Ti/Cu. The barrier layer may include Ta, TaN, Ti, TiN, CoW or a combination thereof. The metal layer may include Cu, Al, Ti, Ta, W, Mo, Ru, Co, Ni, the like, or a combination thereof. The integrated line-and-via structures 132 are referred to as "first metal lines" and "first metal vias" in some examples. Afterwards, upper integrated line-and-via structures, pads and bumps are sequentially formed over the integrated line-and-via structures 132 by known methods, and the details are not iterated herein.

The above embodiments in which the directional etching process of the present disclosure is performed to widen upper portions of gate contact openings and source/drain contact openings are provided for illustration purposes, and are not construed as limiting the present disclosure. In other embodiments, the directional etching process of the present disclosure may be performed to any type of contact openings as needed. Accordingly, the subsequently formed metal contacts of the present disclosure may have other configurations other than the configuration of FIG. 8A, as shown in FIG. 10 to FIG. 14. The difference between them is described below while the similarity is not repeated herein.

Figure 10:
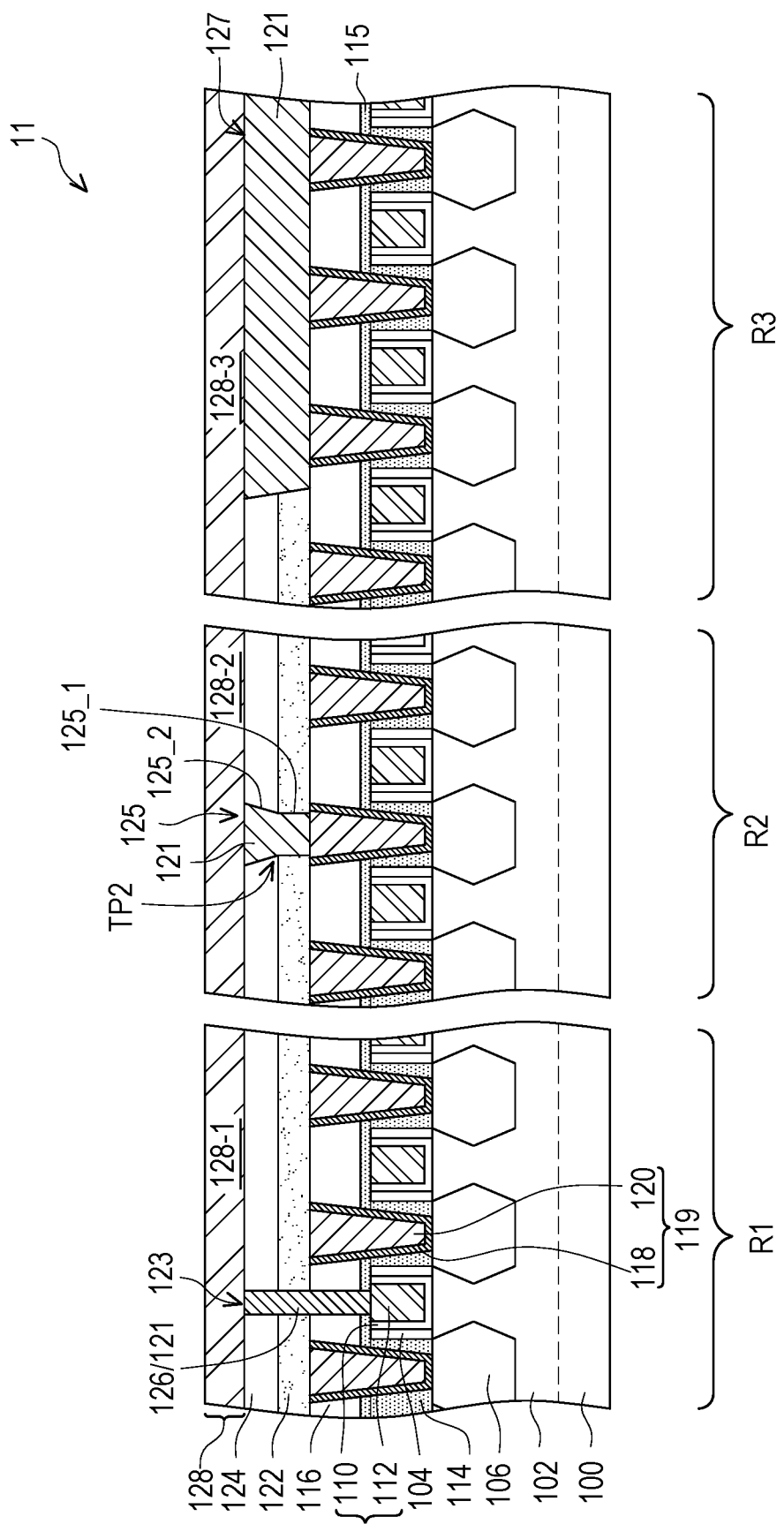
FIG. 10 to FIG. 14 are schematic cross-sectional views of various semiconductor devices according to some embodiments of the present disclosure.

The semiconductor device 11 of FIG. 10 is similar to the semiconductor device 10 of FIG. 8A, and the difference between them lies in the locations of metal contact openings subjected to the directional etching process of the present disclosure. In FIG. 10, only the source/drain contact opening is subjected to the directional etching process of the present disclosure. In some embodiments, the metal layer 126 fills up the opening OP1 in FIG. 3A and constitutes the metal contact 123. In other embodiments, the metal layer 121 fills up the opening OP1 and constitutes the metal contact 123. Accordingly, in the semiconductor device 11 of FIG. 10, the metal contact 123 as a gate contact in the region R1 has a substantially vertical sidewall, the metal contact 125 as a source/drain contact in the region R2 has a turning point TP2 on the sidewall thereof, and the metal contact 127 as a power rail contact in the region R3 has an inclined sidewall.

Figure 11:
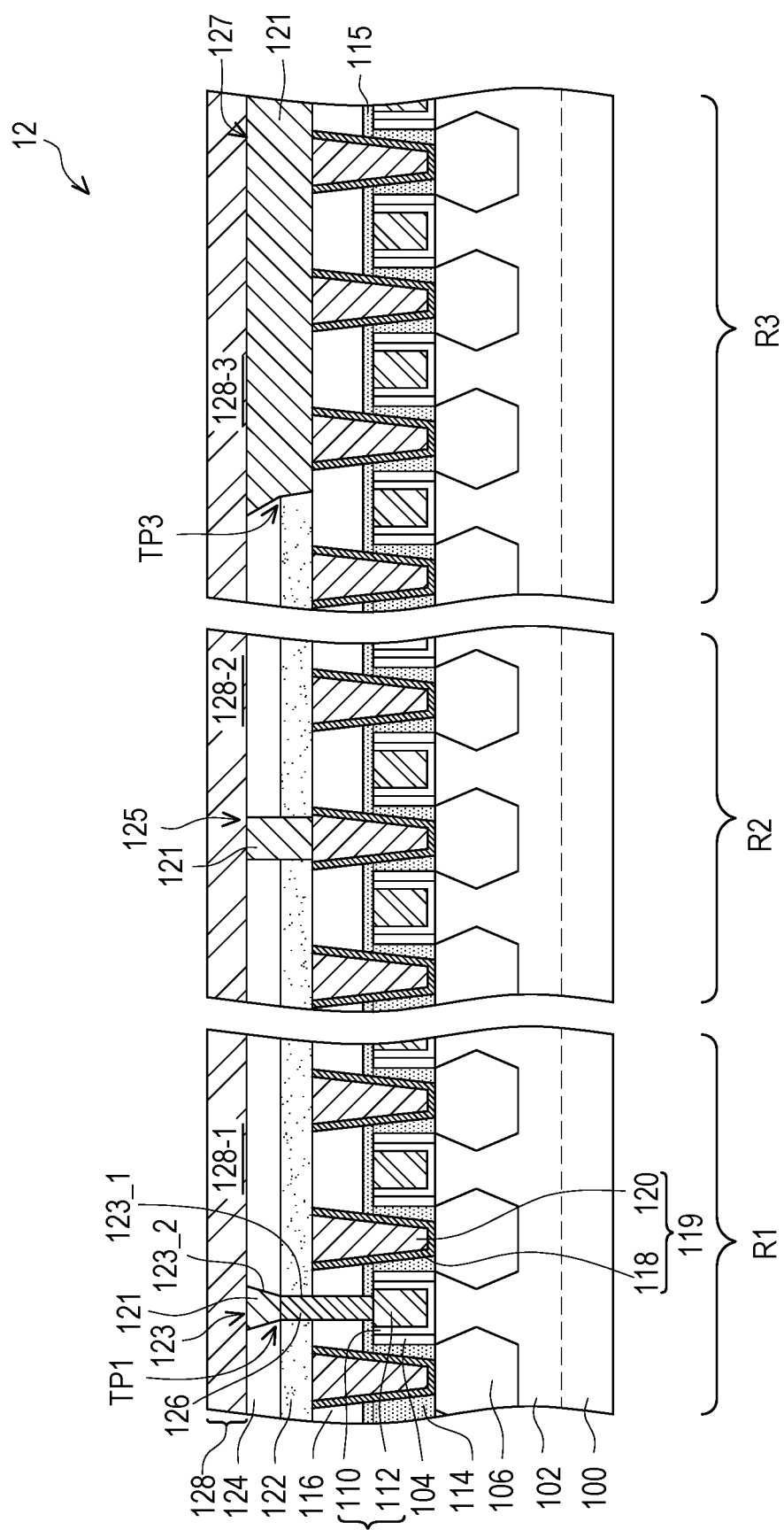

The semiconductor device 12 of FIG. 11 is similar to the semiconductor device 10 of FIG. 8A, and the difference between them lies in the locations of metal contact openings subjected to the directional etching process of the present disclosure. In FIG. 11, the gate contact opening and the power rail contact opening are subjected to the directional etching process of the present disclosure. In some embodiments, the gate contact opening and the power rail contact opening are formed simultaneously, and then subjected to the same directional etching process. Accordingly, in the semiconductor device 12 of FIG. 11, the metal contact 123 as a gate contact in the region R1 has a turning point TP1 on the sidewall thereof, the metal contact 125 as a source/drain contact in the region R2 has a substantially vertical sidewall, and the metal contact 127 as a power rail contact in the region R3 has a turning point TP3 on the sidewall thereof.

Figure 12:
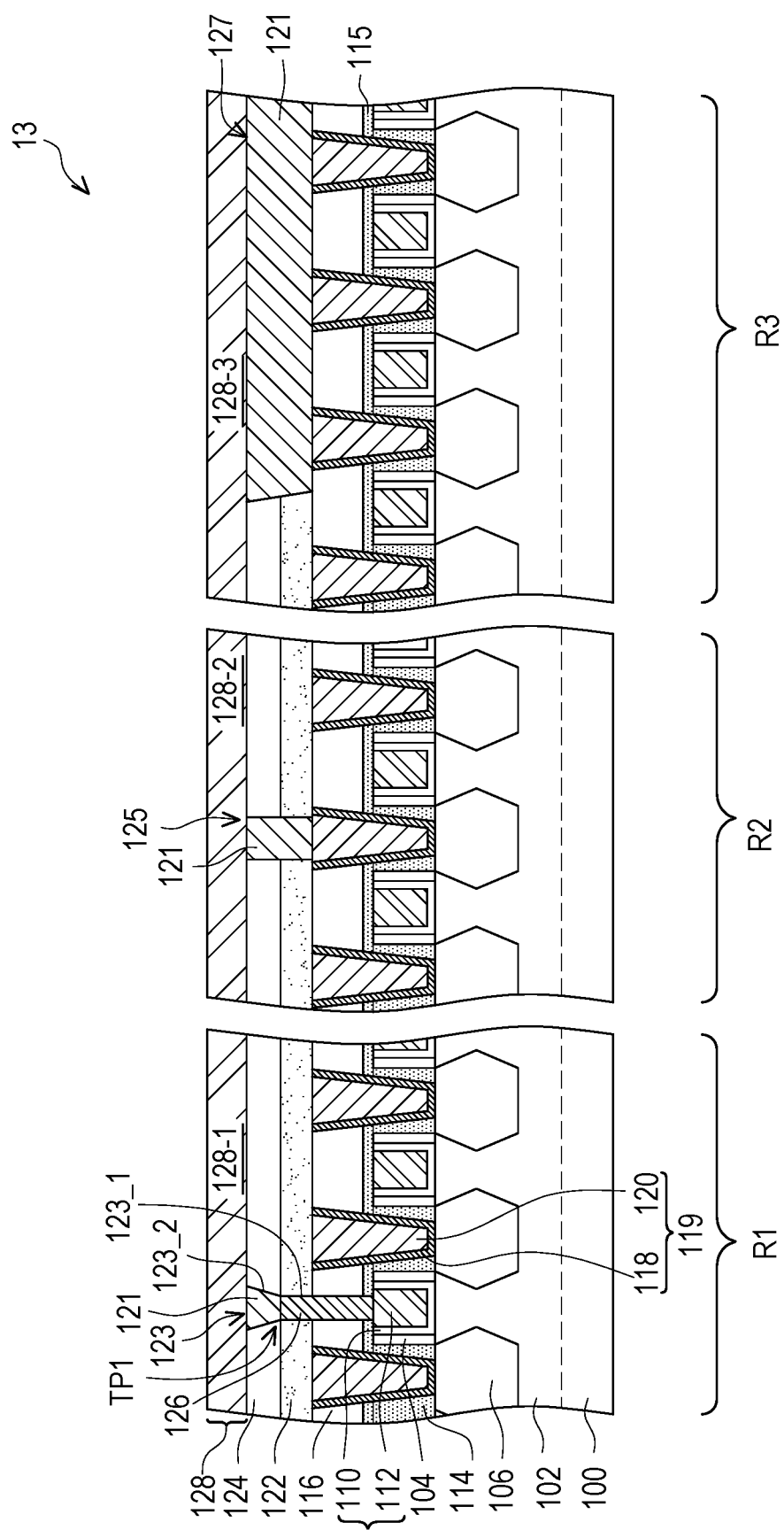

The semiconductor device 13 of FIG. 12 is similar to the semiconductor device 10 of FIG. 8A, and the difference between them lies in the locations of metal contact openings subjected to the directional etching process of the present disclosure. In FIG. 12, only the gate contact opening is subjected to the directional etching process of the present disclosure. Accordingly, in the semiconductor device 13 of FIG. 12, the metal contact 123 as a gate contact in the region R1 has a turning point TP1 on the sidewall thereof, the metal contact 125 as a source/drain contact in the region R2 has a substantially vertical sidewall, and the metal contact 127 as a power rail contact in the region R3 has an inclined sidewall.

Figure 13:
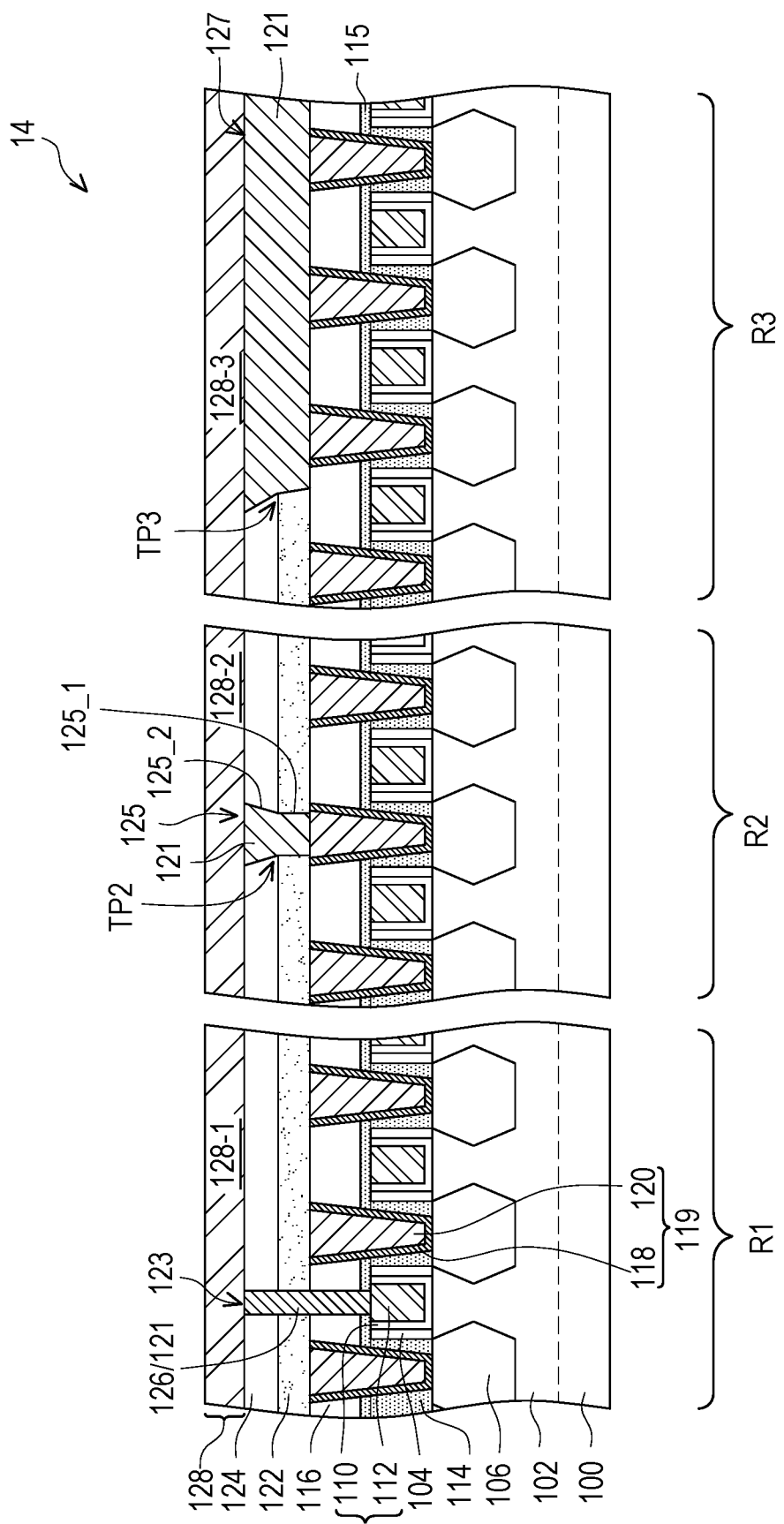

The semiconductor device 14 of FIG. 13 is similar to the semiconductor device 10 of FIG. 8A, and the difference between them lies in the locations of metal contact openings subjected to the directional etching process of the present disclosure. In FIG. 13, the source/drain contact opening and the power rail contact opening are subjected to the directional etching process of the present disclosure. In some embodiments, the metal layer 126 fills up the opening OP1 in FIG. 3A and constitutes the metal contact 123. In other embodiments, the metal layer 121 fills up the opening OP1 and constitutes the metal contact 123. In some embodiments, the source/drain contact opening and the power rail contact opening are formed simultaneously, and then subjected to the same directional etching process. Accordingly, in the semiconductor device 14 of FIG. 13, the metal contact 123 as a gate contact in the region R1 has a substantially vertical sidewall, the metal contact 125 as a source/drain contact in the region R2 has a turning point TP2 on the sidewall thereof, and the metal contact 127 as a power rail contact in the region R3 has a turning point TP3 on the sidewall thereof.

Figure 14:
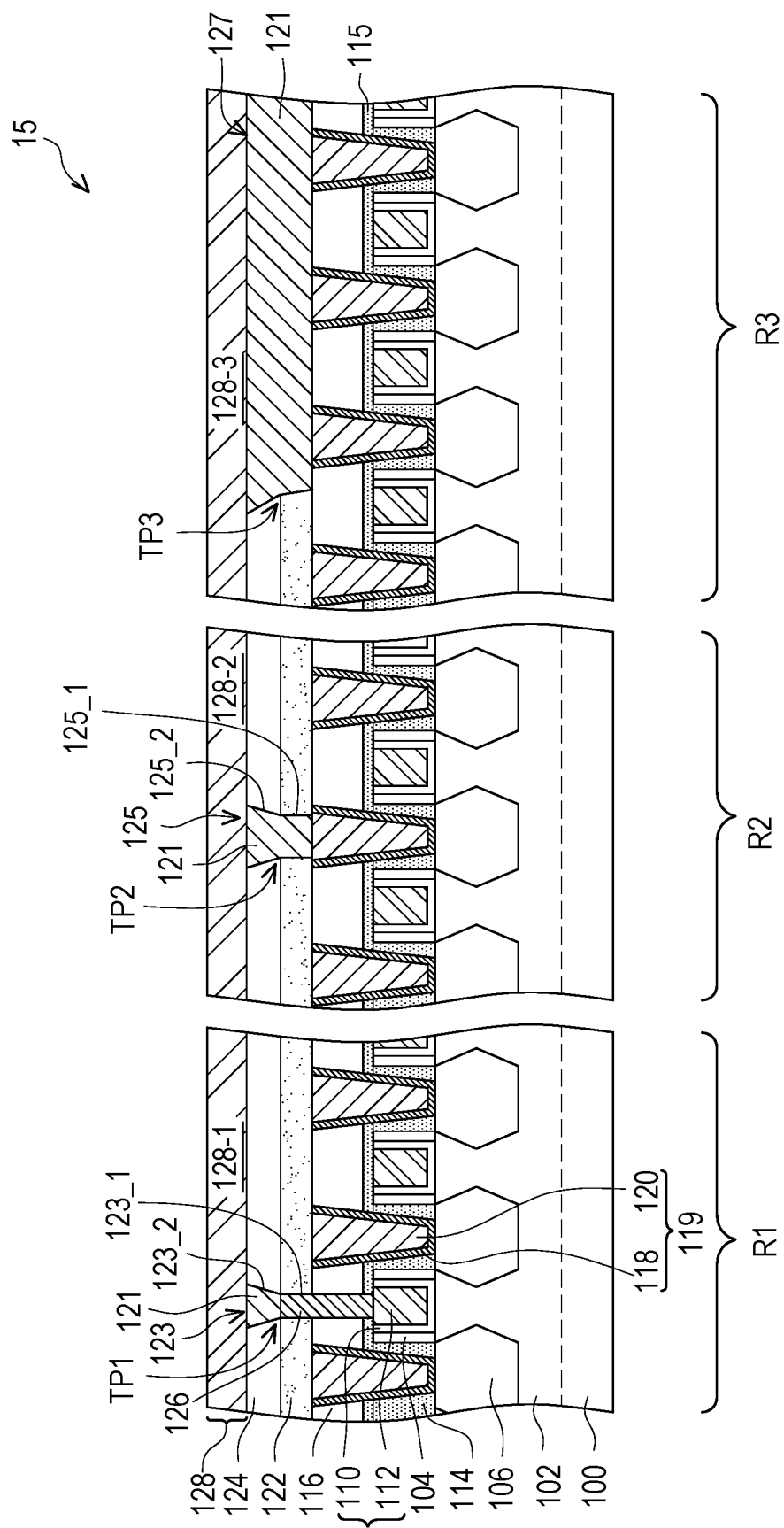

The semiconductor device 15 of FIG. 14 is similar to the semiconductor device 10 of FIG. 8A, and the difference between them lies in the locations of metal contact openings subjected to the directional etching process of the present disclosure. In FIG. 14, the gate contact opening, the source/drain contact opening and the power rail contact opening are all subjected to the directional etching process of the present disclosure. In some embodiments, the gate contact opening, the source/drain contact opening and the power rail contact opening are subjected to the same directional etching process. In some embodiments, the gate contact opening, the source/drain contact opening and the power rail contact opening are subjected to different directional etching processes. Accordingly, in the semiconductor device 15 of FIG. 14, the metal contact 123 as a gate contact in the region R1 has a has a turning point TP1 on the sidewall thereof, the metal contact 125 as a source/drain contact in the region R2 has a turning point TP2 on the sidewall thereof, and the metal contact 127 as a power rail contact in the region R3 has a turning point TP3 on the sidewall thereof.

Figure 15:
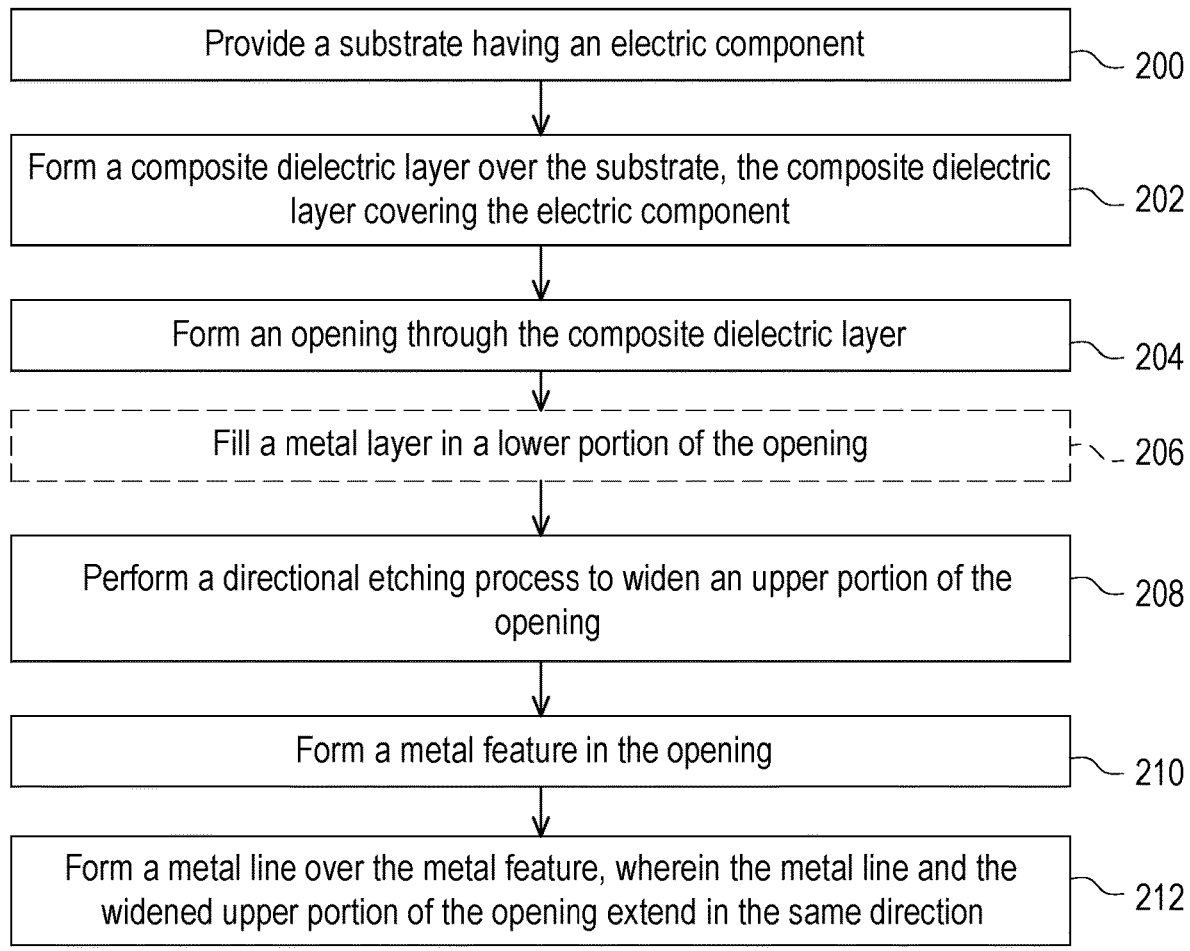
FIG. 15 is a flow chart showing a method of forming a semiconductor device according to some embodiments of the present disclosure.

FIG. 15 is a flow chart showing a method of forming a semiconductor device according to some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 1B:
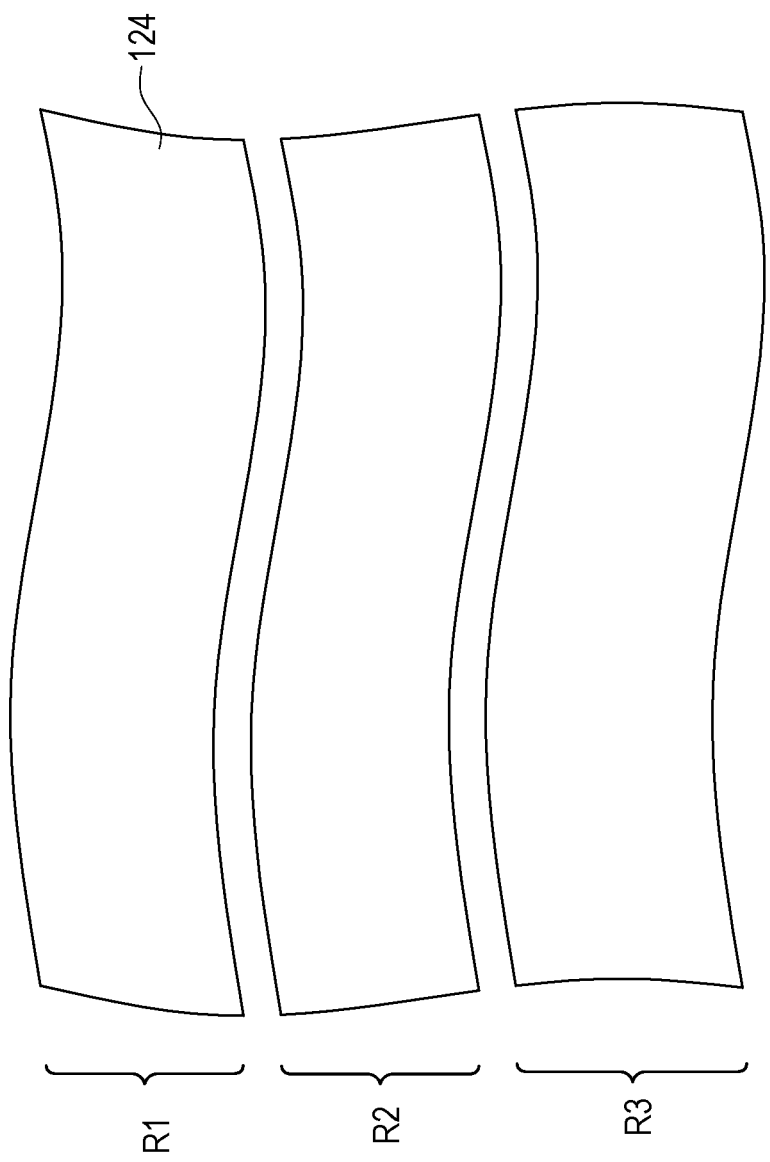

At act 200, a substrate is provided with an electric component. FIG. 1A to FIG. 1B illustrate cross-sectional and top views corresponding to some embodiments of act 200. In some embodiments, the electric component is a gate electrode 110. In other embodiments, the electric component is a strained layer 106. In other embodiments, the electric component is a metal line.

At act 202, a composite dielectric layer is formed over the substrate, covering the electric component. FIG. 1A to FIG. 1B illustrate cross-sectional and top views corresponding to some embodiments of act 202. In some embodiments, the composite dielectric layer includes a lower dielectric layer (e.g., shielding layer 122) and an upper dielectric layer (e.g., dielectric layer 124) with different etch selectivities. The lower dielectric layer functions as an etching stop layer.

At act 204, an opening is formed through the composite dielectric layer. In some embodiments, when opening is the opening OP1, FIG. 2A to FIG. 2B illustrate cross-sectional and top views corresponding to some embodiments of act 204. In some embodiments, when opening is the opening OP2, and FIG. 4A to FIG. 4B illustrate cross-sectional and top views corresponding to some embodiments of act 204. In other embodiments, the opening may be a via opening over the metal line.

At act 206, a metal layer is filled in the lower portion of the opening. In some embodiments, when opening is the opening OP1, FIG. 3A to FIG. 3B illustrate cross-sectional and top views corresponding to some embodiments of act 206. Act 206 is optional and may be omitted as needed.

At act 208, a directional etching process is performed to widen an upper portion of the opening. In some embodiments, an etching gas of the directional etching process includes $CH_3F$, $CH_2F_2$, $CHF_3$, $CH_4$, $CF_4$, $C_4F_8$, $C_4F_6$, $N_2$, $O_2$, Ar, the like, or a combination thereof. In some embodiments, the directional etching process is performed to the upper dielectric layer of the composite dielectric layer, so as to increase a dimension of the upper portion of the opening while unchanging a dimension of a lower portion of the opening in the lower dielectric layer of the composite dielectric layer. In some embodiments, from a top view, the upper portion (e.g., opening OP12 or OP22) of the opening (e.g., opening OP1 or OP2) has an elliptical-like shape, and a lower portion (e.g., opening OP11 or OP21) of the opening (e.g., opening OP1 or OP2) has a circle-like shape. FIG. 5A to FIG. 5B illustrate cross-sectional and top views corresponding to some embodiments of act 208. In other embodiments, the directional etching process is performed to widen an upper portion of the via opening over the metal line.

At act 210, a metal feature is formed in the opening. FIG. 7A to FIG. 7B illustrate cross-sectional and top views corresponding to some embodiments of act 210. In some embodiments, the metal feature is formed in the contact opening over the gate electrode or the strained layer. In other embodiments, the metal feature is formed in the via opening over the metal line.

At act 212, a metal line is formed over the metal feature, wherein the metal line and the widened upper portion of the opening extend in the same direction. FIG. 8A to FIG. 8B illustrate cross-sectional and top views corresponding to some embodiments of act 212.

Figure 16:
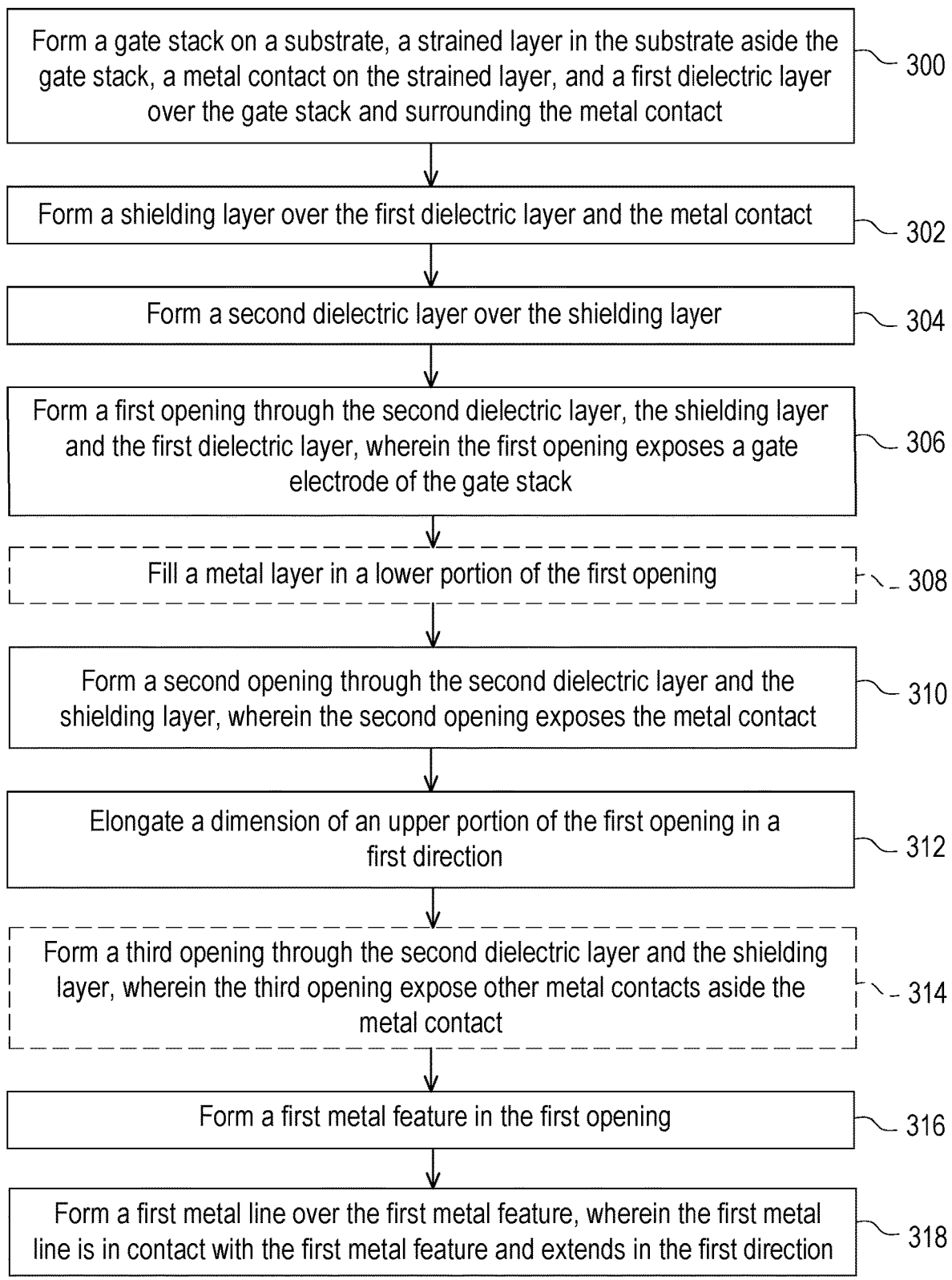
FIG. 16 is a flow chart showing a method of forming a semiconductor device according to some embodiments of the present disclosure.

FIG. 16 is a flow chart showing a method of forming a semiconductor device according to some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 300, a gate stack is formed on a substrate, a strained layer is formed in the substrate aside the gate stack, a metal contact is formed on the strained layer, and a first dielectric layer is formed over the gate stack and surrounds the metal contact. FIG. 1A to FIG. 1B illustrate cross-sectional and top views corresponding to some embodiments of act 300.

At act 302, a shielding layer is formed over the first dielectric layer and the metal contact. FIG. 1A to FIG. 1B illustrate cross-sectional and top views corresponding to some embodiments of act 302.

At act 304, a second dielectric layer is formed over the shielding layer. FIG. 1A to FIG. 1B illustrate cross-sectional and top views corresponding to some embodiments of act 304.

At act 306, a first opening is formed through the second dielectric layer, the shielding layer and the first dielectric layer, wherein the first opening exposes a gate electrode of the gate stack. FIG. 2A to FIG. 2B illustrate cross-sectional and top views corresponding to some embodiments of act 306.

At act 308, a metal layer is filled in a lower portion of the first opening. FIG. 3A to FIG. 3B illustrate cross-sectional and top views corresponding to some embodiments of act 308. Act 308 is optional and may be omitted as needed.

At act 310, a second opening is formed through the second dielectric layer and the shielding layer, wherein the second opening exposes the metal contact. FIG. 4A to FIG. 4B illustrate cross-sectional and top views corresponding to some embodiments of act 310. Act 310 is optional and may be omitted as needed.

At act 312, a dimension of an upper portion of the first opening is elongated in a first direction. In some embodiments, an etching gas for elongating the dimension of the upper portion of the first opening includes $CH_3F$, $CH_2F_2$, $CHF_3$, $CH_4$, $CF_4$, $C_4F_8$, $C_4F_6$, $N_2$, $O_2$, Ar, the like, or a combination thereof. In some embodiments, a dimension of an upper portion of the second opening is elongated during elongating the dimension of the upper portion of the first opening. FIG. 5A to FIG. 5B illustrate cross-sectional and top views corresponding to some embodiments of act 312.

At act 314, a third opening is formed through the second dielectric layer and the shielding layer, wherein the third opening exposes other metal contacts aside the metal contact. FIG. 6A to FIG. 6B illustrate cross-sectional and top views corresponding to some embodiments of act 314. Act 314 is optional and may be omitted as needed. The sequence of forming the first to third openings are not limited by the present disclosure.

At act 316, a first metal feature is formed in the first opening. FIG. 7A to FIG. 7B illustrate cross-sectional and top views corresponding to some embodiments of act 316.

At act 318, a first metal line is formed over the first metal feature, wherein the first metal line is in contact with the first metal feature and extends in the first direction. FIG. 8A to FIG. 8B illustrate cross-sectional and top views corresponding to some embodiments of act 318.

The semiconductor devices of the present disclosure are illustrated below with reference to FIG. 8A to FIG. 14. In some embodiments, a semiconductor device 10/11/12/13/14/15 includes a substrate 100 having an electric component (e.g., gate electrode 110 or strained layer 106), a lower dielectric layer (e.g., shielding layer 122) disposed over substrate 100 and covering the electric component, an upper dielectric layer (e.g., dielectric layer 124) disposed on the lower dielectric layer, and a first metal feature (e.g., metal contact 123, 125 or 127) penetrating through the upper dielectric layer and the lower dielectric layer and electrically connected to the electric component (e.g., gate electrode 110 or strained layer 106). The metal feature (e.g., metal contact 123, 125 or 127) has a turning point (e.g., TP1, TP2 or TP3) around an interface between the lower dielectric layer and the upper dielectric layer. The turning point of the metal feature may be lower than or higher than the interface between the lower dielectric layer and the upper dielectric layer.

In some embodiments, the lower dielectric layer (e.g., shielding layer 122) and the upper dielectric layer (e.g., dielectric layer 124) are provided with different etch selectivities.

In some embodiments, from a top view, as shown in FIG. 8B, the upper part (e.g., 123_2 or 125_2) of the metal feature (e.g., metal contact 123 or metal contact 125) has an elliptical-like shape or an oval-like shape, and the lower part (e.g., 123_1 or 125_1) of the metal feature (e.g., metal contact 123 or metal contact 125) has a circle-like shape.

In some embodiments, from a cross-sectional view, as shown in FIG. 8A and FIGS. 10-14, the upper part (e.g., 123_2 or 125_2) of the metal feature (e.g., metal contact 123 or metal contact 125) has an inclined sidewall, and the lower part (e.g., 123_2 or 125_2) of the metal feature (e.g., metal contact 123 or metal contact 125) has a substantially straight sidewall.

In some embodiments, from cross-sectional views, as shown in FIG. 11, FIG. 13 and FIG. 14, the upper part and the lower part of the metal feature (e.g., metal contact 127) have inclined sidewalls, but the slope of the upper part of the metal feature (e.g., metal contact 127) is greater than the slope of the lower part of the metal feature (e.g., metal contact 127).

In some embodiments, from cross-sectional views, as shown in FIG. 10 and FIG. 13, a profile of the metal feature (e.g., metal contact 123) is different from the profile of other metal features (e.g., metal contact 125 or metal contact 127).

In some embodiments, from cross-sectional views, as shown in FIG. 11 and FIG. 12, a profile of the metal feature (e.g., metal contact 125) is different from the profile of other metal features (e.g., metal contact 123 or metal contact 127).

In some embodiments of the present disclosure, with an ex-situ directional etching process, the upper portion of an opening and therefore the upper part of a metal feature (e.g., metal contact/via, power rail contact, etc.) are widened to increase the contact area with the overlying metal line, while the lower portion of the opening and therefore the lower part of the metal feature maintain substantially unchanged to meet the time dependent dielectric breakdown (TDDB) window requirements. Therefore, the semiconductor structure is formed with lower contact resistance, higher speed and improved reliability.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In accordance with some embodiments of the present disclosure, a method of forming a semiconductor device includes the following operations. A substrate is provided with an electric component. A composite dielectric layer is formed on the substrate and covers the electric component. An opening is formed through the composite dielectric layer. A directional etching process is performed to widen an upper portion of the opening. A metal feature is formed in the opening.

In accordance with some embodiments of the present disclosure, a method of forming a semiconductor device includes the following operations. A gate stack is formed on a substrate. A strained layer is formed in the substrate aside the gate stack. A metal contact is formed on the strained layer. A first dielectric layer is formed over the gate stack and surrounding the metal contact. A shielding layer is formed over the first dielectric layer and the metal contact. A second dielectric layer is formed over the shielding layer. A first opening is formed through the second dielectric layer, the shielding layer and the first dielectric layer, wherein the first opening exposes a gate electrode of the gate stack. A dimension of an upper portion of the first opening is elongated in a first direction. A first metal feature is formed in the first opening.

In accordance with some embodiments of the present disclosure, a semiconductor device includes a substrate having an electric component, a lower dielectric layer disposed over substrate and covering the electric component, an upper dielectric layer disposed on the lower dielectric layer, and a first metal feature penetrating through the upper dielectric layer and the lower dielectric layer and electrically connected to the electric component. The metal feature has a turning point around an interface between the lower dielectric layer and the upper dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    providing a substrate having an electric component;
    forming a composite dielectric layer over the substrate, the composite dielectric layer covering the electric component;
    forming an opening through the composite dielectric layer;
    performing a directional etching process to widen an upper portion of the opening; and
    forming a metal feature in the opening,
    wherein the method further comprises, after widening an upper portion of the opening, forming another opening through a portion of the composite dielectric layer, wherein the another opening exposes metal contacts aside the electric component.

2. The method of claim 1, wherein from a top view, the upper portion of the opening has an elliptical-like shape, and a lower portion of the opening has a circle-like shape.

3. The method of claim 1, wherein the electric component comprises a gate electrode.

4. The method of claim 1, wherein the composite dielectric layer comprises a lower dielectric layer and an upper dielectric layer with different etch selectivities.

5. The method of claim 4, wherein the directional etching process is performed to the upper dielectric layer, so as to increase a dimension of the upper portion of the opening while unchanging a dimension of a lower portion of the opening in the lower dielectric layer.

6. The method of claim 1, further comprising forming a metal line over the metal feature, wherein the metal line and the widened upper portion of the opening extend in the same direction.

7. The method of claim 1, further comprising, after forming the opening and before the directional etching process, filling a metal layer in a lower portion of the opening.

8. The method of claim 1, wherein an etching gas of the directional etching process comprises $CH_3F$, $CH_2F_2$, $CHF_3$, $CH_4$, $CF_4$, $C_4F_8$, $C_4F_6$, $N_2$, $O_2$, Ar, the like, or a combination thereof.

9. A method of forming a semiconductor device, comprising:
    forming a gate stack on a substrate, a strained layer in the substrate aside the gate stack, a metal contact on the strained layer, and a first dielectric layer over the gate stack and surrounding the metal contact;
    forming a shielding layer over the first dielectric layer and the metal contact;
    forming a second dielectric layer over the shielding layer;
    forming a first opening through the second dielectric layer, the shielding layer and the first dielectric layer, wherein the first opening exposes a gate electrode of the gate stack;
    elongating a dimension of an upper portion of the first opening in a first direction; and
    forming a first metal feature in the first opening,
    wherein the method further comprises, after forming the first opening and before elongating the dimension of the upper portion of the first opening, filling a metal layer in a lower portion of the first opening.

10. The method of claim 9, further comprising forming a first metal line over the first metal feature, wherein the first metal line is in contact with the first metal feature and extends in the first direction.

11. The method of claim 9, wherein the upper portion of the first opening has an inclined sidewall, and a lower portion of the first opening has a substantially straight sidewall.

12. The method of claim 9, wherein an etching gas for elongating the dimension of the upper portion of the first opening comprises $CH_3F$, $CH_2F_2$, $CHF_3$, $CH_4$, $CF_4$, $C_4F_8$, $C_4F_6$, $N_2$, $O_2$, Ar, the like, or a combination thereof.

13. The method of claim 9, further comprising, after filling the metal layer in the lower portion of the first opening and before elongating the dimension of the upper portion of the first opening, forming a second opening through the second dielectric layer and the shielding layer, wherein the second opening exposes the metal contact.

14. The method of claim 13, further comprising elongating a dimension of an upper portion of the second opening during elongating the dimension of the upper portion of the first opening.

15. The method of claim 9, further comprising, after elongating the dimension of the upper portion of the first opening, forming a third opening through the second dielectric layer and the shielding layer, wherein the third opening exposes other metal contacts aside the metal contact.

16. A method of forming a semiconductor device, comprising:
    forming a gate stack on a substrate, a strained layer in the substrate aside the gate stack, a metal contact on the strained layer, and a first dielectric layer over the gate stack and surrounding the metal contact;
    forming a shielding layer over the first dielectric layer and the metal contact;
    forming a second dielectric layer over the shielding layer;
    forming a first opening through the second dielectric layer, the shielding layer and the first dielectric layer, wherein the first opening exposes a gate electrode of the gate stack;
    elongating a dimension of an upper portion of the first opening in a first direction; and
    forming a first metal feature in the first opening, wherein the method further comprises, after elongating the dimension of the upper portion of the first opening, forming a second opening through the second dielectric layer and the shielding layer, wherein the second opening exposes other metal contacts aside the metal contact.

17. The method of claim 16, further comprising forming a first metal line over the first metal feature, wherein the first metal line is in contact with the first metal feature and extends in the first direction.

18. The method of claim 16, wherein the upper portion of the first opening has an inclined sidewall, and a lower portion of the first opening has a substantially straight sidewall.

19. The method of claim 16, further comprising, after forming the first opening and before elongating the dimension of the upper portion of the first opening, filling a metal layer in a lower portion of the first opening.

20. The method of claim 16, wherein an etching gas for elongating the dimension of the upper portion of the first opening comprises $CH_3F$, $CH_2F_2$, $CHF_3$, $CH_4$, $CF_4$, $C_4F_8$, $C_4F_6$, $N_2$, $O_2$, Ar, the like, or a combination thereof.

* * * * *